(12) United States Patent
Cole et al.

(10) Patent No.: US 11,366,158 B2
(45) Date of Patent: Jun. 21, 2022

(54) TEST SYSTEM FOR TESTING THE INTEGRITY OF AN ELECTRONIC DEVICE

(71) Applicant: TeraView Limited, Cambridge (GB)

(72) Inventors: Bryan Edward Cole, Cambridge (GB); Darius Sullivan, Cambridge (GB); Simon Chandler, Cambridge (GB)

(73) Assignee: TeraView Limited, Cambridge (GB)

( * ) Notice: Subject to any disclaimer, the term of this patent is extended or adjusted under 35 U.S.C. 154(b) by 137 days.

(21) Appl. No.: 16/061,375

(22) PCT Filed: Dec. 16, 2016

(86) PCT No.: PCT/GB2016/053976
§ 371 (c)(1),
(2) Date: Jun. 12, 2018

(87) PCT Pub. No.: WO2017/103619
PCT Pub. Date: Jun. 22, 2017

(65) Prior Publication Data
US 2018/0364301 A1    Dec. 20, 2018

(30) Foreign Application Priority Data

Dec. 18, 2015    (GB) ...................................... 1522432

(51) Int. Cl.
*G01R 31/28* (2006.01)
*G01R 1/073* (2006.01)
(Continued)

(52) U.S. Cl.
CPC ....... *G01R 31/2887* (2013.01); *G01R 31/308* (2013.01); *G01R 35/005* (2013.01)

(58) Field of Classification Search
CPC ............ G01R 31/2887; G01R 1/06705; G01R 1/07342
See application file for complete search history.

(56) References Cited

U.S. PATENT DOCUMENTS 4,507,605 A    3/1985  Geisei
4,541,770 A *  9/1985  Niinomi ................... B25J 9/009
                                               414/730
(Continued)

FOREIGN PATENT DOCUMENTS

CN    1761883 A    4/2006
CN    1790047 A    6/2006
(Continued)

OTHER PUBLICATIONS

A. Fraser et al., "High-Speed Digital IC Package Characterization, Using Microwave Probing and Fixturing Techniques," Cascade Microtech, 1991, pp. 1-18.
(Continued)

*Primary Examiner* — Alesa Allgood
(74) *Attorney, Agent, or Firm* — Blank Rome LLP

(57) ABSTRACT

A test system for testing a device having a plurality of electrical contacts. The test system comprising: a device table operable to hold at least one device under test, a probe comprising at least one probe end for contacting electrical contacts of a device under test, a movement mechanism operable to move one or both of the device table and the probe so as to bring the at least one probe end into contact with at least one electrical contact of a device under test, and a profile determining system configured to determine a profile of the electrical contacts of a device under test.

16 Claims, 8 Drawing Sheets

(51) Int. Cl.
*G01R 31/00* (2006.01)
*G01R 31/308* (2006.01)
*G01R 35/00* (2006.01)

(56) References Cited

U.S. PATENT DOCUMENTS

| | | | |
|---|---|---|---|
| 5,410,259 | A | 4/1995 | Fujihara et al. |
| 5,642,056 | A | 6/1997 | Nakajima et al. |
| 5,742,173 | A | 4/1998 | Nakagomi et al. |
| 5,748,006 | A | 5/1998 | Sano |
| 5,778,016 | A | 7/1998 | Sucha et al. |
| 6,239,590 | B1 | 5/2001 | Krivy et al. |
| 8,630,321 | B2 | 1/2014 | Sucha et al. |
| 2003/0030459 | A1 | 2/2003 | Sabey |
| 2006/0097743 | A1 | 5/2006 | Komatsu |
| 2007/0096763 | A1 | 5/2007 | Ehrmann et al. |
| 2009/0079452 | A1 | 3/2009 | Eldridge et al. |
| 2010/0105224 | A1 | 4/2010 | Narita et al. |
| 2013/0015871 | A1* | 1/2013 | Cleary .............. G01R 31/2884 324/754.03 |
| 2013/0133168 | A1 | 5/2013 | Yamaguchi |
| 2014/0021963 | A1* | 1/2014 | Cole .................. G01R 31/28 324/537 |
| 2014/0021970 | A1 | 1/2014 | Endres et al. |
| 2014/0175591 | A1 | 6/2014 | Tian et al. |
| 2014/0266279 | A1* | 9/2014 | Nelson .................. G01R 3/00 324/755.09 |
| 2015/0241472 | A1 | 8/2015 | Negishi et al. |
| 2017/0057171 | A1* | 3/2017 | Chang .................. B29C 64/236 |

FOREIGN PATENT DOCUMENTS

| | | |
|---|---|---|
| CN | 1892246 A | 1/2007 |
| CN | 100340864 C | 10/2007 |
| EP | 0 853 242 A1 | 7/1998 |
| JP | H10-38980 A | 2/1998 |
| JP | H-11-304419 A | 11/1999 |
| JP | 2006-135129 A | 5/2006 |

OTHER PUBLICATIONS

GiqaTest Labs, "GTL Signal Integrity Characterization System," pp. 1-2.

* cited by examiner

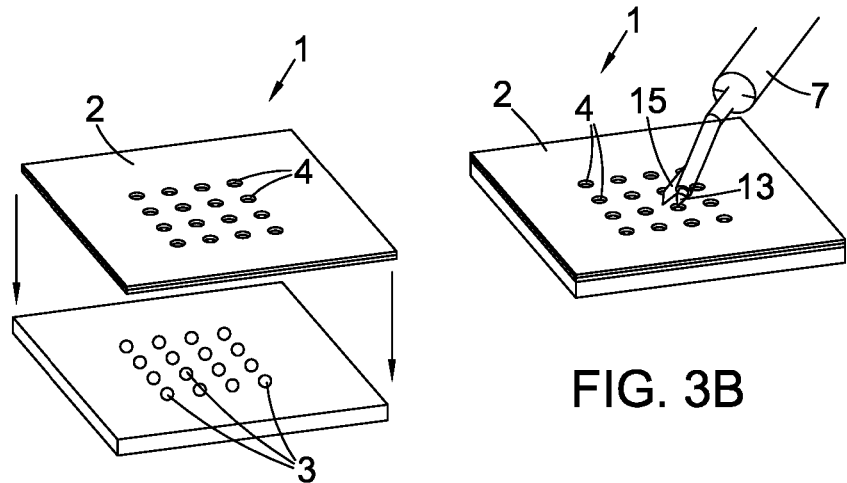
FIG. 3A
FIG. 3B
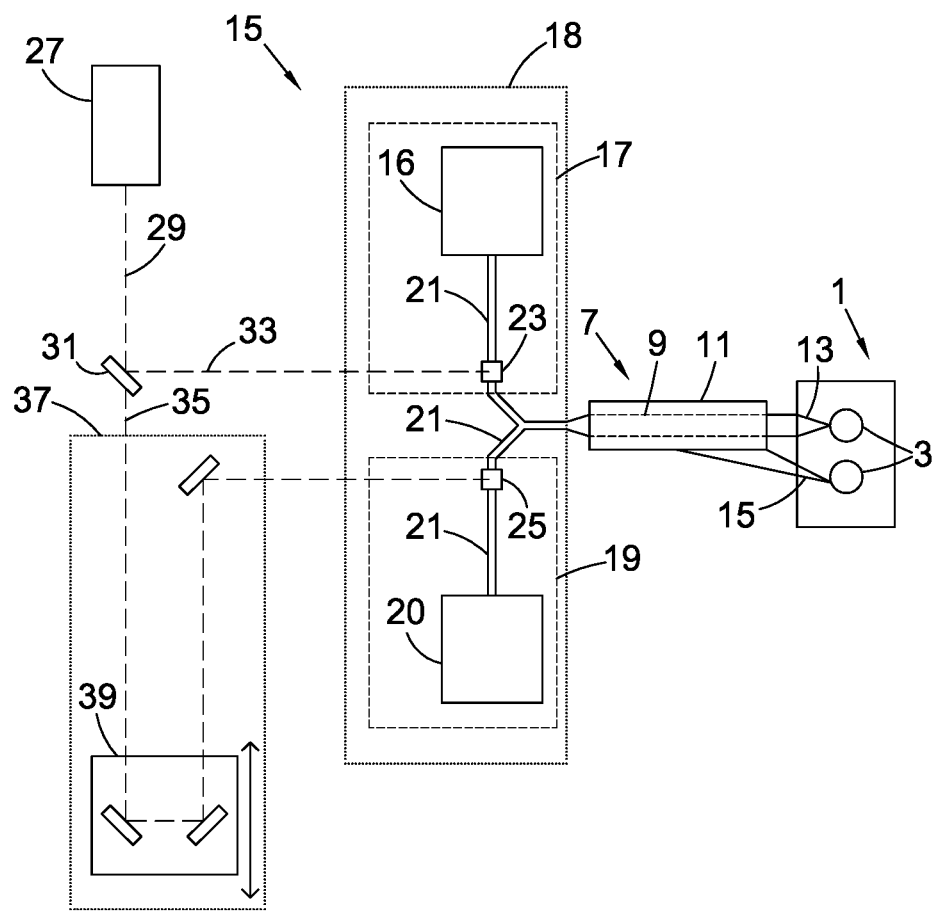
FIG. 4

TEST SYSTEM FOR TESTING THE INTEGRITY OF AN ELECTRONIC DEVICE

FIELD

The present invention relates to a test system. In particular the present invention relates to a test system for testing the integrity of an electronic device.

BACKGROUND

An electronic device to be tested may, for example, comprise a semiconductor device (e.g. an integrated circuit). After manufacture of an electronic device it is desirable to test the device. For example, the integrity of one or more circuits in the electronic device may be tested.

Methods of testing an electronic device may, for example, comprise inputting an electronic signal (e.g. a pulsed signal) into the device and measuring any reflections of the signal from the device. If the device includes any breaks or short circuits in its circuits then a signal which is input to the device will be at least partially reflected. If no defects are present in the device than little or none of the input signal will be reflected from the device. Measurement of reflected signals from a device under test (DUT) may therefore be used to test the integrity of the device and detect any faults in the device.

Test systems which are suitable for testing a DUT have previously been proposed, for example, in US20140021963 which is hereby incorporated herein by reference in its entirety.

It is an object of the present invention to provide an improved test system which obviates or mitigates one or more problems of the prior art, whether identified herein or otherwise.

SUMMARY OF THE INVENTION

According to a first aspect of the invention there is provided a test system for testing a device having a plurality of electrical contacts, the test system comprising: a device table operable to hold at least one device under test; a probe comprising at least one probe end for contacting an electrical contact of a device under test; a movement mechanism operable to move one or both of the device table and the probe so as to bring the at least one probe end into contact with at least one electrical contact of a device under test; and a profile determining system configured to determine a profile of the electrical contacts of a device under test.

The profile determining system may be configured to determine a three dimensional profile of the electrical contacts of a device under test. The determined profile may comprise a plurality of locations at which a surface of the electrical contacts is positioned. For example, the determined profile may comprise a determined height of the electrical contacts at different locations on the device under test. The profile determining system may be configured to determine a profile of the device under test, which includes regions of the device under test located in between the electrical contacts. The profile may, for example, comprise the height of the device under test at different locations on the device under test.

The position, size and/or shape of the electrical contacts of a device under test may be different for different devices and may not be known prior to testing the device. The profile of the electrical contacts of a device under test, which is determined by the profile determining system may be used to determine positions to which the probe should be moved (relative to the device table) in order for the probe ends to contact electrical contacts of the device under test. The movement mechanism may move one or both of the device table and the probe to the determined positions, so as to bring the probe ends into contact with the electrical contacts. This may allow an automated process to be performed by which the probe can be connected to the electrical contacts in order to test the device through the electrical contacts.

An automated process may significantly reduce the amount of time required to test a device (when compared to manually moving the probe so as to contact the electrical contacts). In some embodiments, the movement mechanism may move one or both of the device table and the probe so as to contact a plurality of different electrical contacts at different times. This may allow a device to be tested through a plurality of different electrical contacts. In such embodiments the time required to test a device through a plurality of different electrical contacts is significantly reduced by an automated system for bringing the probe ends into contact with the electrical contacts.

The movement mechanism may be operable translate one or both of the device table and the probe and/or may be operable to rotate one or both of the device table and the probe. In general the movement mechanism may be operable to perform any movement of the device table and/or the probe which alters the position and/or orientation of the device table and/or the probe table.

The probe may comprise at least two probe ends and the movement mechanism may be operable to bring the at least two probe ends into contact with at least two electrical contacts of a device under test. The at least two probe ends may be in contact with the at least two electrical contacts simultaneously.

A device under test may include a ground plate. The ground plate may be a separate element to the rest of the device and may be positioned on the device for the purposes of testing the device. A ground plate which is situated on a device is considered to form part of the device under test. Furthermore, the ground plate is considered to be an example of an electrical contact of a device under test to which a probe end may be contacted. Any reference herein to contacting an electrical contact on a device under test is intended to include contacting a ground plate placed on a device.

The profile determining system may comprise: a radiation source configured to illuminate at least a portion of a device under test with radiation; a radiation sensor, configured to detect radiation scattered from electrical contacts of the device under test; and a controller configured to determine from the detected scattered radiation a profile of the electrical contacts of a device under test.

Radiation scattered from different parts of a device under test may appear at different positions in a field of view of the radiation sensor. The controller may determine, from the positions in the field of view in which scattered radiation appears, the position on a device under test from which radiation is scattered. This may allow the position and/or the shape of scattering surfaces of the device under test to be determined.

The radiation sensor may be arranged such that different parts of the device under test which extend away from the device table by different amounts appear at different positions in the field of view of the radiation sensor.

This ensures that radiation scattered from different distances from the device table appear at different positions in a field of view of the radiation sensor. The position in the field of view at which scattered radiation appears therefore allows the distance from the device table from which radiation is scattered to be determined. This allows the height of different points on the device under test to be determined and thus the profile of the device under test may be derived.

The radiation sensor may be orientated at an oblique angle with respect to a direction of propagation of radiation emitted from the radiation source.

The radiation source may be configured to illuminate a strip of a device under test with a strip of radiation.

The radiation sensor may be configured to detect radiation scattered from electrical contacts which lie within the strip of radiation, and wherein the controller is configured to determine a height of points of the device under test which lie within the illuminated strip of the device under test.

The movement mechanism may be operable to move one or both of the device table and the radiation source so as to scan the strip of radiation over the device under test and wherein the controller is configured to combine determined heights of points of the device under test at different positions of the strip of radiation so as to determine a profile of the electrical contacts of a device under test.

The device table may comprise a plurality of reference structures extending out of or into the device table and wherein the profile determining system is configured to determine the position of the profile of the electrical contacts of a device under test, relative to the position of the reference structures.

The reference structures provide known reference points against which the position of the electrical contacts of a device under test may be determined. Knowledge of the position of the electrical contact points relative to the reference structures allows the position to which the probe should be moved, in order to contact the electrical contacts, to be determined.

The reference structures may extend out of the device table, and wherein at least two of the reference structures extend out of the device table by different distances.

The movement mechanism may be operable to move one or both of the device table and the probe such that at least one of the probe ends contacts one of the reference structures.

The test system may further comprise a calibration system configured to allow a determination of the position of the at least one probe end relative to the reference structure.

Determining the position of a probe end relative to a reference structure allows the probe end to be accurately brought into contact with the reference structure. This provides a reference point of a known configuration of the movement mechanism which results in a known position of the probe relative to the device table. This may allow other configurations of the movement mechanism which result in other positions of the probe relative to the device table to be determined. With knowledge of the positions of the electrical contacts, relative to the device table, the probe may then be accurately moved to contact desired electrical contacts.

The calibration system may be the same as the profile determining system. For example, the position of the at least one probe end relative to the reference structure may be determined using the same procedure for determining the profile of the electrical contacts. Alternatively a different procedure may be used. For example, the calibration system may comprise a camera or a microscope which may be used to directly observe the position of a probe end relative to the reference structure.

The movement mechanism may be adjusted manually whilst viewing the position of the probe end relative to the reference structure (e.g. through a camera or microscope) until the probe end is brought into contact with the reference structure.

In some embodiments, the calibration system may comprise means for detecting contact between a probe end and reference structure. For example, the calibration system may comprise an electrical continuity tester which detects electrical continuity between a probe end and a reference structure. The calibration system may comprise one or more pressure sensors on a probe and/or a reference structure which are configured to detect contact between the probe end and the reference structure.

The profile determining system may be further configured to determine the position of a probe end relative to an electrical contact of a device under test.

This may allow the position of the probe relative to the device under test and/or the device table to be determined. This enables a calibration of the position of the probe relative to the device table to be updated during a test procedure for testing the device under test.

The profile determining system may, for example, determine the position of a probe end relative to an electrical contact of a device under test, when the probe end is in proximity to the electrical contact.

The test system may further comprise a controller configured to determine, from the determined profile of the electrical contacts of a device under test, a configuration of the movement mechanism which brings the at least one probe end into contact with at least one electrical contact of the device under test.

According to a second aspect of the invention there is provided a test system for testing a device having a plurality of electrical contacts, the test system comprising: a device table operable to hold at least one device under test; a probe comprising at least one probe end for contacting electrical contacts of a device under test; and a movement mechanism operable to move one or both of the device table and the probe so as to bring the at least one probe end into contact with at least one electrical contact of a device under test; wherein the device table comprises a plurality of reference structures extending out of or into the device table.

The reference structures provide reference points at known positions on the device table. A calibration may be performed in which the position of electrical contacts of a device under test and the position of the probe ends relative to the reference structures are determined. Determining the position of the electrical contacts and the probe ends relative to the reference structures may allow the position of the probe ends relative to the electrical contacts to be determined. This allows the movement mechanism to move one or both of the device table and the probe so as to accurately bring the probe ends into contact with the electrical contacts, thereby allowing the probe to test the device under test through the electrical contacts.

The device table may comprise at least three reference structures. In some embodiments the device table may comprise more than three reference structures, for example, eight reference structures.

The probe may comprise at least two probe ends and the movement mechanism may be operable to bring the at least two probe ends into contact with at least two electrical contacts on a device under test. The at least two probe ends may be in contact with the at least two electrical contacts simultaneously.

A device under test may include a ground plate. The ground plate may be a separate element to the rest of the device and may be positioned on the device for the purposes of testing the device. A ground plate which is situated on a device is considered to form part of a device under test. Furthermore the ground plate is considered to be an example of an electrical contact of a device under test to which a probe end may be contacted. Any reference herein to contacting an electrical contact on a device under test is intended to include contacting a ground plate placed on a device.

At least two of the reference structures extend out of or into the device table by different distances.

At least two of the reference structures extending out of or into the device table by different distances advantageously increases the accuracy with which the position of features (e.g. the electrical contacts and one or more probe ends) can be determined relative to the reference structures. In some embodiments, the reference structures may all extend out of or into the device table by approximately the same distance. However, in such embodiments accurately contacting electrical contacts which are positioned at different heights may rely on the accuracy and linearity of the profile determining system. By positioning reference structures at different heights (i.e. extending out of or into the device table by different distances) references may be taken at different heights. This may allow any non-linearity or scaling error in the profiling determining system to be compensated for and the accuracy with which electrical contacts located at different heights are contacted may be improved.

The distance with which a reference structure extends out of or into the device table may be referred to as the height of the reference structure. A region of the device table which is configured to support at least one device under test may lie substantially in a supporting plane. The distance with which a reference structure extends out of or into the device table may be taken to be a distance in a direction which is normal to the supporting plane. In some embodiments, the reference structures may extend out of the supporting plane and the distance with which a reference structure extends out of or into the device table may be taken to be the distance which the reference structure extends out of the supporting plane. In other embodiments the reference structures may extend out of a plane other than the supporting plane. For example, the reference structures may be positioned on a different vertical level to the supporting plane. The reference structures may extend out of a plane which is substantially parallel with the supporting plane. The distance with which a reference structure extends out of or into the device table may be taken to be the distance which a reference structure extends out of a plane which is substantially parallel with the supporting plane.

The movement mechanism may be operable to move one or both of the device table and the probe such that at least one of the probe ends contacts one of the reference structures.

The movement mechanism may be operated manually to bring a probe end into contact with a reference structure. For example, the probe end and the reference structure may be viewed through a camera or a microscope and the movement mechanism may be operated manually whilst viewing the probe end and the reference structure through a camera or a microscope. The movement mechanism may be guided to bring a probe end into contact with a reference structure.

The test system may further comprise a calibration system configured to allow a determination of the position of the at least one probe end relative to the reference structure.

As was described above, with reference to the first aspect, determining the position of a probe end relative to a reference structure allows a probe end to be accurately brought to contact a reference structure. This provides a reference point of a known configuration of the movement mechanism which results in a known position of the probe relative to the device table. This may allow other configurations of the movement mechanism which result in other positions of the probe relative to the device table to be determined. With knowledge of the positions of the electrical contacts, relative to the device table, the probe may then be accurately moved to contact desired electrical contacts.

The calibration system may, for example, comprise a camera or a microscope which may be used to directly observe the position of a probe end relative to a reference structure. Alternatively the calibration system may comprise a profile determining system as described with respect to the first aspect.

In some embodiments, the calibration system may comprise means for detecting contact between a probe end and a reference structure. For example, the calibration system may comprise an electrical continuity tester which detects electrical continuity between a probe end and a reference structure. The calibration system may comprise one or more pressure sensors on a probe and/or a reference structure which are configured to detect contact between the probe end and the reference structure.

At least one of the reference structures may comprise a reference feature marking a reference point on the reference structure, wherein the movement mechanism is operable to move one or both of the device table and the probe such that at least one of the probe ends contacts the reference point.

The reference feature provides a more precise positional reference point to which the probe end may be accurately moved. This increases the precision of a measurement of the position of the probe relative to the device table. The reference feature provides a point on the reference structure which is resolvable by inspection (either direct visual inspection or by inspection through an inspection instrument (e.g. a camera or microscope)). This allows a probe end to be guided into contact with the reference point.

The reference feature may be provided on a convex or protruding surface of the reference structure. This may reduce the chances of a probe end being unintentionally brought into contact with other regions of the reference structure.

The reference feature may, for example, comprise a circular groove in the reference structure and a probe end may be brought to contact a reference point which lies within an area bounded by the circular groove. The reference feature may, for example, surround an apex of the reference structure. For example, in embodiments in which the reference feature comprises a circular groove in the reference structure, the circular groove may extend around an apex of the reference structure. The reference feature marks a reference point which lies substantially at the apex of the reference structure and within the bounds of the circular groove. A probe end may be brought into contact with the apex of the reference structure (i.e. the reference point).

The reference feature may have dimension which is approximately equal to the size of a probe end.

The reference feature may comprise a substantially circular groove formed in a reference structure and extending around an apex of the reference structure.

The reference feature may comprise a plurality of substantially circular grooves formed in a reference structure, each groove extending around an apex of the reference structure.

At least one of the reference structures may comprise a substantially spherically shaped tip portion.

The spherically shaped tip portion is surrounded by a substantially flat rim.

At least one of the reference structures comprises a surface having roughness features on a scale of 50 microns or less.

The roughness features may, for example, comprise ridges which are machined into the surface of the reference structure.

The device table may be operable to hold a plurality of devices under test.

The test system of may further comprise a kinematically constrained mount on which the device table is mounted, wherein the kinematically constrained mount is configured to constrain movement of the device table in a plurality of degrees of freedom.

The kinematically constrained mount may, for example, constrain movement of the device table in six degrees of freedom The test system may further comprise a loading device operable to automatically load and unload devices under test from the device table.

The test system may further comprise: a signal generator configured to generate a signal and direct the signal through at least one of the probe ends such that, in use, the signal is directed into a device under test through an electrical contact of the device under test; and a signal sampler configured to sample a signal, which passes through at least one of the probe ends such that, in use, signal which is reflected in the device under test and which passes through a probe end is sampled by the signal sampler.

The signal generator may be configured to generate a broadband signal having frequency components in the range 0.01 GHz to 10 THz.

The broadband signal may only have frequency components which are less than about 1 THz. The broadband signal may not necessarily have frequency components across an entire range specified herein but may merely have frequency components which occupy a small region of a range specified herein. For example, the broadband signal may, in some embodiments, be restricted to frequency components in a range of approximately 0.25 GHz-200 GHz. Such a signal is considered to be an example of a broadband signal having frequency components in the range 0.01 GHz to 10 THz.

The signal generator may comprises a source of pulsed radiation; a first signal conversion device arranged to receive a pulse of radiation from the source of pulsed radiation and configured to output a signal pulse in response to irradiation from the source of pulsed radiation; and a transmission line arrangement configured to direct the signal pulse from the first signal conversion device through at least one of the probe ends.

The first signal conversion device may be configured to generate an electrical signal based upon an optical signal. The first signal conversion device may, for example, comprise a photoconductive element. Alternatively the first signal conversion device may comprise an electro-optic device.

The signal sampler may comprise a second signal conversion device arranged to receive a pulse of radiation from the source of pulsed radiation and, in response to irradiation from the source of pulsed radiation, sample a signal pulse received at the second signal conversion device; wherein the transmission line arrangement is configured to direct a signal pulse reflected from a device under test or transmitted through a device under test and passing through at least one of the probe ends, to the second signal conversion device.

The second signal conversion device may be configured to generate an electrical signal based upon an optical signal. The second signal conversion device may, for example, comprise a photoconductive element. Alternatively the second signal conversion device may comprise an electro-optic device. The source of pulsed radiation may comprise a single radiation source or may comprise separate radiation sources for illuminating the first signal conversion device and the second signal conversion device. For example, the source of pulsed radiation may comprise a first laser configured to illuminate the first signal conversion device and a second laser configured to illuminate the second signal conversion device.

According to a third aspect of the invention there is provided a test system for testing a device, the test system comprising: a source of pulsed radiation configured to provide a generating radiation beam and a receiving radiation beam, wherein the generating and receiving radiation beams are pulsed radiation beams; a first signal conversion device arranged to receive a pulse of the generating radiation beam and configured to output a signal pulse in response to receiving a pulse of the generating radiation beam; a second signal conversion device arranged to receive a pulse of the receiving radiation beam and configured to sample a signal pulse in response to receiving a pulse of the receiving radiation beam; a transmission line arrangement configured to direct a signal pulse from the first signal conversion device to a device under test and to direct a signal pulse reflected from the device under test or transmitted through a device under test to the second signal conversion device; and a direct-drive delay line positioned in the optical path of the generating radiation beam and/or the receiving radiation beam, the delay line being configured to introduce an optical delay between the generating and receiving radiation beams such that a pulse of the generating radiation beam is incident on the first signal conversion device at a different time to a corresponding pulse of the receiving radiation beam being incident on the second signal conversion device; wherein the delay line comprises: at least one reflector positioned in the optical path of the generating and/or receiving radiation beams; and a synchronous linear motor configured to move the reflector so as to vary the optical path length of the generating and/or receiving radiation beams so as to vary the optical delay between the generating and receiving radiation beams.

A direct-drive delay line comprising a synchronous linear motor allows rapid scanning of the delay line such that reflections and/or transmissions from the device under test at a plurality of different time delays with respect to an input signal pulse can be analysed quickly. A direct-drive delay line may, for example, be operable to scan a delay time at a speed which is comparable to the speed of a galvanometer driven delay line. The direct-drive delay line is however capable of scanning a larger range of delay times than a galvanometer driven delay line, thereby removing any requirement for a separate fast scanning delay line and a slow scanning delay line. The overall acquisition time of a measurement may be greatly improved with respect to prior art arrangements. For example, the acquisition time may be of the order of 60 times faster than is achievable with prior art arrangements.

The synchronous linear motor may be a brushless motor.

The first and/or the second signal conversion device may be configured to generate an electrical signal based upon an optical signal. The first and/or the second signal conversion device may, for example, comprise a photoconductive element. Alternatively the first and/or the second signal conversion device may comprise an electro-optic device.

The source of pulsed radiation may comprise a single radiation source and beam splitter configured to split the output of the radiation source into a generating radiation beam and a receiving radiation beam. Alternatively the source of pulses radiation may comprise separate radiation sources which emit the generating and receiving radiation beams respectively. For example, the source of pulsed radiation may comprise a first laser configured to emit the generating radiation beam and a second laser configured to emit the second radiation beam.

According to a fourth aspect of the invention there is provided a test system for testing a device, the test system comprising: a source of pulsed radiation configured to provide a generating radiation beam and a receiving radiation beam, wherein the generating and receiving radiation beams are pulsed radiation beams; a first signal conversion device arranged to receive a pulse of the generating radiation beam and configured to output a signal pulse in response to receiving a pulse of the generating radiation beam; a second signal conversion device arranged to receive a pulse of the receiving radiation beam and configured to sample a signal pulse in response to receiving a pulse of the receiving radiation beam; a transmission line arrangement configured to direct a signal pulse from the first signal conversion device to a device under test and to direct a signal pulse reflected from the device under test or transmitted through a device under test to the second signal conversion device; and a delay line comprising: a first reflector positioned in the optical path of the generating radiation beam; a second reflector positioned in the optical path of the receiving radiation beam; and a moveable stage on which the first reflector and the second reflector are mounted such that movement of the moveable stage in a first direction increases the optical path length of the generating radiation beam and decreases the optical path length of the receiving radiation beam and movement of the moveable stage in a second direction decreases the optical path length of the generating radiation beam and increases the optical path length of the receiving radiation beam.

This arrangement means that movement of a moveable stage changes the optical path lengths of the generating and receiving radiation beams in opposite directions. Consequently movement of the moveable stage by a first distance introduces a difference in the optical path lengths of the generating and receiving radiation beams which is at least twice the first distance. A smaller movement of the moveable stage is therefore required in order to change the optical delay between the generating and receiving radiation beams (with respect to prior art arrangements) by a given amount. This advantageously allows for faster scanning of the optical delay. An acquisition time in which a given measurement is performed may therefore be reduced. The moveable stage may be moved by a motor (e.g. a synchronous linear motor).

The first and/or the second signal conversion device may be configured to generate an electrical signal based upon an optical signal. The first and/or the second signal conversion device may, for example, comprise a photoconductive element. Alternatively the first and/or the second signal conversion device may comprise an electro-optic device.

The source of pulsed radiation may comprise a single radiation source and beam splitter configured to split the output of the radiation source into a generating radiation beam and a receiving radiation beam. Alternatively the source of pulses radiation may comprise separate radiation sources which emit the generating and receiving radiation beams respectively. For example, the source of pulsed radiation may comprise a first laser configured to emit the generating radiation beam and a second laser configured to emit the second radiation beam.

According to a fifth aspect of the invention there is provided a test system for testing a device, the test system comprising: a source of pulsed radiation configured to provide a generating radiation beam and a receiving radiation beam, wherein the generating and receiving radiation beams are pulsed radiation beams; a first signal conversion device arranged to receive a pulse of the generating radiation beam and configured to output a signal pulse in response to receiving a pulse of the generating radiation beam; a second signal conversion device arranged to receive a pulse of the receiving radiation beam and configured to sample a signal pulse in response to receiving a pulse of the receiving radiation beam; a transmission line arrangement configured to direct a signal pulse from the first signal conversion device to a device under test and to direct a signal pulse reflected from the device under test or transmitted through a device under test to the second signal conversion device; and a radiation feedback system comprising; a radiation sensor configured to detect the intensity of pulses of radiation emitted from the source of pulsed radiation; an attenuator positioned in the optical path of pulses of radiation emitted from the source of pulsed radiation, the attenuator being configured to reduce the intensity of the pulses of radiation by an adjustable amount; and a controller configured to adjust the amount by which the attenuator reduces the intensity of the pulses of radiation in response to measurements of the intensity of pulses of the radiation by the radiation sensor.

The controller may adjust the attenuator such that an average power of radiation pulses is substantially constant with time, where the average is taken over a time period greater than a single pulse period. Pulses of radiation may, for example, be transmitted from the source of pulsed radiation to the radiation sensor through an optical fibre. Changes in, for example, the coupling efficiency of the optical fibre result in changes in the intensity of radiation received at the radiation detector and are detected by the radiation sensor. The controller may respond to changes in the intensity measured by the radiation detector so as to compensate for any changes in, for example, the coupling efficiency of the optical fibre.

The controller may, for example, be a proportional-integral-derivative (PID) controller.

The first and/or the second signal conversion device may be configured to generate an electrical signal based upon an optical signal. The first and/or the second signal conversion device may, for example, comprise a photoconductive element. Alternatively the first and/or the second signal conversion device may comprise an electro-optic device.

The source of pulsed radiation may comprise a single radiation source and beam splitter configured to split the output of the radiation source into a generating radiation beam and a receiving radiation beam. Alternatively the source of pulses radiation may comprise separate radiation sources which emit the generating and receiving radiation beams respectively. For example, the source of pulsed radiation may comprise a first laser configured to emit the generating radiation beam and a second laser configured to emit the second radiation beam.

Features of different aspects of the invention may be combined with features of other aspects of the invention.

BRIEF DESCRIPTION OF THE DRAWINGS

Embodiments of the invention will now be described, by way of example, only with reference to the accompanying schematic drawings in which:

FIGS. 3A and 3B are schematic illustrations of an electronic device which includes a ground plate;

FIG. 4 is a schematic illustration of a portion of a test system which may form part of an embodiment of the invention;

DETAILED DESCRIPTION

Figure 1:
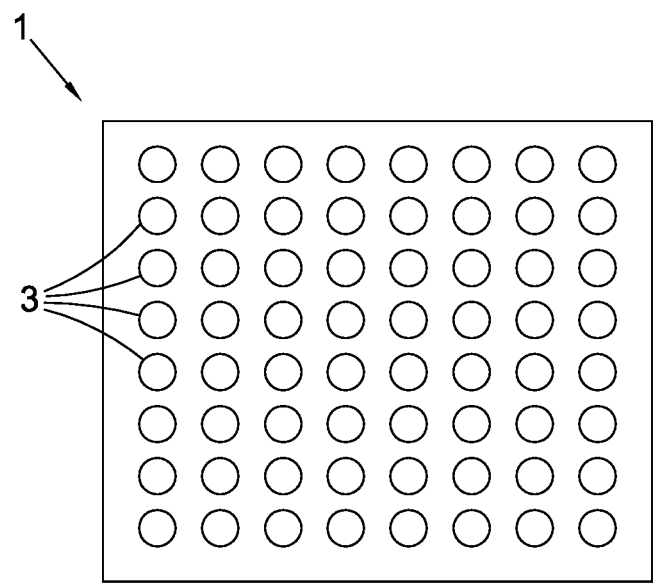
FIG. 1 is a schematic illustration of an electronic device for testing using a test system according to an embodiment of the invention.

FIG. 1 is a schematic illustration of an electronic device 1 which may be tested using a test system according to an embodiment of the invention. The electronic device 1 may be referred to as a device under test (DUT). The DUT 1 comprises a plurality of electrical contacts 3. The plurality of electrical contacts 3 may, for example, comprise a ball-grid array (BGA), a land-grid array (LGA) or a pin-grid array (PGA). The DUT may be tested by making simultaneous electrical contact between at least two of the electrical contacts 3 and a probe.

Figure 2:
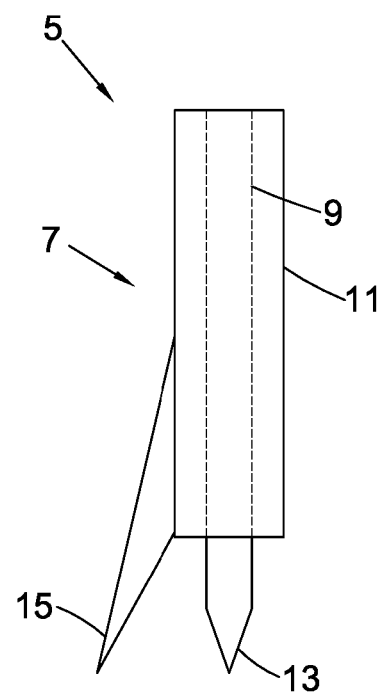
FIG. 2 is a schematic illustration of a probe which may be used to establish electrical contact with the electronic device of FIG. 1.

FIG. 2 is a schematic illustration of a probe 5 which may be used to establish electrical contact with electrical contacts 3 of a DUT 1. The probe 5 comprises a coaxial cable section 7 which terminates in a first probe end 13 and second probe end 15. The coaxial cable section 7 comprises an inner conductor 9 surrounded by an outer conductor 11, which are arranged in a coaxial transmission line configuration (the dotted line used to illustrate the inner conductor 9 indicates that the inner conductor 9 is encased by the outer conductor 11). The inner conductor 9 is electrically isolated from the outer conductor 11. Towards the end of the probe 7, the inner transmission 9 extends out of the outer conductor 11 and tapers to form the first probe end 13. The second probe end 15 is formed of a fin which extends out of the outer conductor 11 and which is electrically coupled to the outer conductor 11.

In order to test a DUT 1, the first probe end 13 may be contacted with a first electrical contact 3 on the DUT 1 and the second probe end 15 may be contacted with a second electrical contact 3 on the DUT 1. The inner conductor 9 and the first probe end 13 may be used to input a signal into the DUT 1 and may therefore be considered to carry a live current. The second probe end 15 and the outer conductor 11 may be used to conduct a ground current. Alternatively the inner conductor 9 may conduct a ground current and the outer conductor 11 may conduct a live current.

In some embodiments, a probe may comprise more than two probe ends. For example, a probe may comprise three probe ends. A probe comprising three probe ends may comprise one probe end which conducts a live current and two probe ends which each conduct a ground current. Such a configuration may be referred to as a ground-signal-ground probe configuration.

In some embodiments a DUT 1 may be provided with a ground plate to which a connection to ground may be made. FIGS. 3A and 3B are schematic illustrations of a DUT 1 which includes a ground plate 2. FIG. 3A shows the ground plate 2 separated from the rest of the DUT 1 and FIG. 3B shows the ground plate 2 in contact with the rest of the DUT 1. The ground plate 2 includes openings 4 through which electrical contacts 3 may be accessed.

A ground plate 2 may comprise a laminate structure. For example, the ground plate 2 may comprise a conducting upper layer and an insulating lower layer. The conducting upper layer may, for example, comprise gold-plated copper. The insulating lower layer may, for example, comprise a polymer (e.g. Polytetrafluoroethylene (PTFE)). The lower insulating layer acts to prevent electrical contact between the contacts 3 and the conducting upper layer.

As shown in FIG. 3B a DUT 1 may be tested by bringing a first probe end 13 of a probe 7 into contact with an electrical contact 3 and a second probe end 15 into contact with the ground plate 2. A ground plate 2 may be a separate element to a device to be tested and may only be placed onto the device in order to test the device. For example, a ground plate 2 may be placed onto a device in order to test an electrical contact which does not have a suitable adjacent contact to which a second probe end may be connected.

Whilst a ground plate may be a separate element to device to be tested, for the purposes of this description a ground plate 2 placed on a device is considered to form part of the device under test DUT 1. Furthermore the ground plate 2 is considered to be an example of an electrical contact of a DUT 1 to which a probe end 13, 15 may be contacted. Any reference herein to contacting an electrical contact 3 on a DUT 1 is intended to include contacting a ground plate 2 placed on a device.

FIG. 4 is a schematic illustration of a portion of a test system 15 which may form part of an embodiment of the invention. The test system 15 comprises a signal generator 17 and a signal sampler 19. The signal generator 17 may, for example, generate a broadband signal having frequency components in the range 0.01 GHz to 10 THz. In some embodiments, the signal generator may generate a broadband signal having frequency components in the range 0.25 GHz to 200 GHz. A broadband signal may not necessarily have frequency components across an entire range specified herein but may merely have frequency components which occupy a small region of a range specified herein. For example, a broadband signal which has frequency components in a range of approximately 0.25 GHz-200 GHz (but for example does not have substantial frequency components at frequencies greater than about 200 GHz) is considered to be an example of a broadband signal having frequency components in the range 0.01 GHz to 10 THz.

The signal generator 17 generates signals for inputting into a DUT 1. The signal sampler 19 receives and analyses signals which are reflected from the DUT 1. Both the signal generator 17 and the signal sampler 19 are connected to a probe 7 via transmission lines 21. The probe 7 may, for example, be similar to the probe 7 which was described above with reference to FIG. 2 and will not be described in any more detail with reference to FIG. 4. Like reference numerals in FIGS. 2 and 4 denote like features of the probe 7.

A first probe end 13 of the probe 7 is connected to a first electrical contact 3 on the DUT 1. The second probe end 15 is connected to a second electrical contact 3 on the DUT 1. For ease of illustration only two electrical contacts 3 are shown on the DUT 1 in FIG. 4. However, it will be appreciated that the DUT 1 may comprise more than two electrical contacts 3.

The inner conductor 9 of the probe 7, which is electrically connected to the first probe end 13, is connected to the transmission lines 21 which transmit signals from the signal generator 17 and to the signal sampler 19. Signals generated by the signal generator 17 may therefore be transmitted through the transmission lines 21, the inner conductor 9 of the probe 7, the first probe end 13 and into an electrical contact 3 of the DUT 1. Any signal which is reflected in the DUT 1 may be transmitted through the first probe end 13, the inner conductor 9 of the probe 7, the transmission lines 21 and to the signal sampler 19 for analysis.

The signal generator 17 includes a biasing element 16 and a first photoconductive element 23. The signal sampler 19 includes a measurement device 20 and a second photoconductive element 25. The first and second photoconductive elements are electrically conductive in response to illumination by radiation and are not substantially electrically conductive when they are not illuminated with radiation. The first and second photoconductive elements 23, 25 may be selectively illuminated with radiation in order to generate signals at the first photoconductive element 23 and sample signals at the second photoconductive element 25. The signal generator 17 and the signal sampler 19 may be considered to form a sampling module 18 operable to input signal pulses into a DUT 1 through a probe 7 and receive signal reflections from the DUT 1.

The test system 15 further comprises a radiation source 27. The radiation source 27 emits pulses of radiation in the form of a pulsed radiation beam 29. The radiation source 27 may, for example, comprise a laser. The radiation beam is incident on a beam splitter 31 which splits the pulsed radiation beam 29 into a generating beam 33 comprising generating pulses and a receiving beam 35 comprising receiving pulses. The generating beam 33 is directed to be incident on the first photoconductive element 23 and the receiving beam 35 is directed to be incident on the second photoconductive element 25.

The pulsed generating beam 33 causes pulses of signal to be generated at the first photoconductive element 23 and input into the DUT 1. The biasing element 16 applies a potential to the first photoconductive element 23. For example, the biasing element 16 may apply a DC potential or an AC potential (e.g. having a frequency of approximately 30 KHz) to the first photoconductive element 23. When a pulse of radiation is incident on the first photoconductive element 23 a signal pulse is generated at the first photoconductive element 23 due to the combination of the biasing element 16 and the illumination of the first photoconductive element 23. The first photoconductive element therefore acts to generate an electrical signal based upon an optical signal.

The pulsed receiving beam 35 acts to sample electronic signals received at the second photoconductive element 25 at select times (when the second photoconductive element 25 receives a pulse of radiation). The signal which is sampled at the second photoconductive element 25 is measured by the measurement device 20. The second photoconductive element 25 may be considered to generate an electrical signal (which is measured by the measuring device 20) based upon an optical signal (provided by the receiving beam 35). The electrical signal generated at the second photoconductive element 25 is also based upon a signal which is reflected from the DUT 1. This process may be referred to as sampling a signal.

The optical path of the receiving beam 35 to the second photoconductive element 25 includes a delay line 37 configured to introduce an optical delay between a generating pulse of the generating beam 33 and a receiving pulse of the receiving beam 35. The optical delay which is introduced by the delay line 37 causes a generating pulse to be incident on the first photoconductive element 23 at a different time to a corresponding receiving pulse being incident on the second photoconductive element 25. Consequently there is a delay between a signal pulse being sent to the DUT 1 (from the signal generator 17) and reflected signal being sampled by the second photoconductive element 22 and received by the measurement device 20.

The delay time between the input signal pulses and reflections being sampled by the signal sampler 19 may be adjusted in order to analyse reflections from the DUT 1 at different delay times after a pulse is input to the DUT 1. The delay line 37 includes a moveable stage 39 on which reflectors in the optical path of the receiving beam 35 are mounted. Movement of the moveable stage 39 (as indicated by the double-headed arrow in FIG. 4) changes the optical path length of the receiving beam 35 and therefore changes the optical delay between a generating pulse 33 being incident on the first photoconductive element 23 and a receiving pulse being incident on the second photoconductive element 25. The moveable stage 39 may, for example, be scanned, in order to analyse reflections from the DUT 1, at different delay times.

It should be appreciated that the components which are shown in FIG. 4 are not shown to scale. The test system 15 may comprise different components to those depicted in FIG. 4 and described above and/or may comprise additional components to those described and depicted. Details of other embodiments of a test system are given in US20140021963 which is incorporated herein by reference in its entirety. Any of the features which are disclosed in US20140021963 may be used in conjunction with a test system described herein.

As was described above, the first photoconductive element 23 and the second photoconductive element 25 generate electrical signals based upon optical signals. The first and second photoconductive elements 23, 25 may be considered to be examples of signal conversion devices. In some embodiments a signal conversion device other than a photoconductive element may be used. For example, the first and/or second photoconductive elements 23, 25 may be replaced by other forms of signal conversion device.

An alternative signal conversion device which may form part of an embodiment of the invention may be an electro-optic device such as an electro-optic crystal. An electro-optic crystal which forms part of a signal generator may be configured to receive a polarised radiation beam (e.g. the generating beam 33) and generate an electrical signal based upon the polarised radiation beam.

An electro-optic crystal which forms part of a signal sampler may be configured such that an optical property of the crystal changes in response to being subjected to an electric field. For example, the birefringence of the crystal may change in response to being subjected to an electric field. An electrical signal which is incident on an electro-optic crystal from a DUT 1 subjects the crystal to an electric field. The receiving beam 35 may be directed to be incident on the electro-optic crystal and the receiving beam 35 which is transmitted by the crystal may be detected by one or more sensors. A change in an optical property of the crystal (e.g. the birefringence) induces a change in the receiving beam 35 which is transmitted by the crystal and may be detected by the one or more sensors. For example, a signal from a DUT 1 may serve to alter the polarisation state and/or amplitude of a receiving beam 35 which is transmitted by the crystal. A change in polarisation state and/or amplitude may, for example, be measured, for example, using polarising optics and one or more photodiode sensors. This may result in a measurement signal which is proportional to a signal received from a DUT 1.

Similarly to the operation of the photoconductive elements described above, electro-optic crystals may be used in conjunction with pulsed generating and receiving beams 33, 35 to generate signal pulses and sample reflected signals at select times. An optical delay may be introduced between the generating and receiving beams 33, 35 so as to allow reflections received at different delay times to be analysed (as was described above with reference to embodiments including photoconductive elements).

In some embodiments different forms of signal conversion devices may be used in a signal generator 17 and a signal sampler 19. For example, a photoconductive element may be used in a signal generator 17 and an electro-optic crystal may be used in a signal sampler 19.

Whilst embodiments have been described above in which a radiation beam 29 is emitted from a radiation source 27 and split into generating and receiving beams 33, 35, in some embodiments separate radiation sources may be used to generate the generating and receiving beams. For example, in some embodiments a dual laser system comprising two synchronised lasers may be used. The lasers may be synchronised in a controllable manner such that an optical delay between radiation beams emitted from the two lasers may be controlled and adjusted (e.g. electronically). In such embodiments, the synchronisation between the lasers may be adjusted in order to analyse signals received at different delay times (as was described above with reference to the delay line 37). Embodiments which include a dual laser system may not therefore include a delay line, since the function of a delay line may be replaced by adjusting a synchronisation between lasers. However, in some embodiments a delay line may still be used in conjunction with a dual laser system.

In embodiments which include more than one radiation source (e.g. a dual laser system) the plurality of radiation sources may be considered to together form a source of pulsed radiation. References herein to a source of pulsed radiation are intended to include a single radiation source or a plurality of radiation sources, such as a dual laser system. In embodiments in which a source of pulsed radiation comprises a single radiation source, the source of pulsed radiation may further comprise a beam splitter configured to split a radiation beam into a generating radiation beam and a receiving radiation beam.

Figure 5:
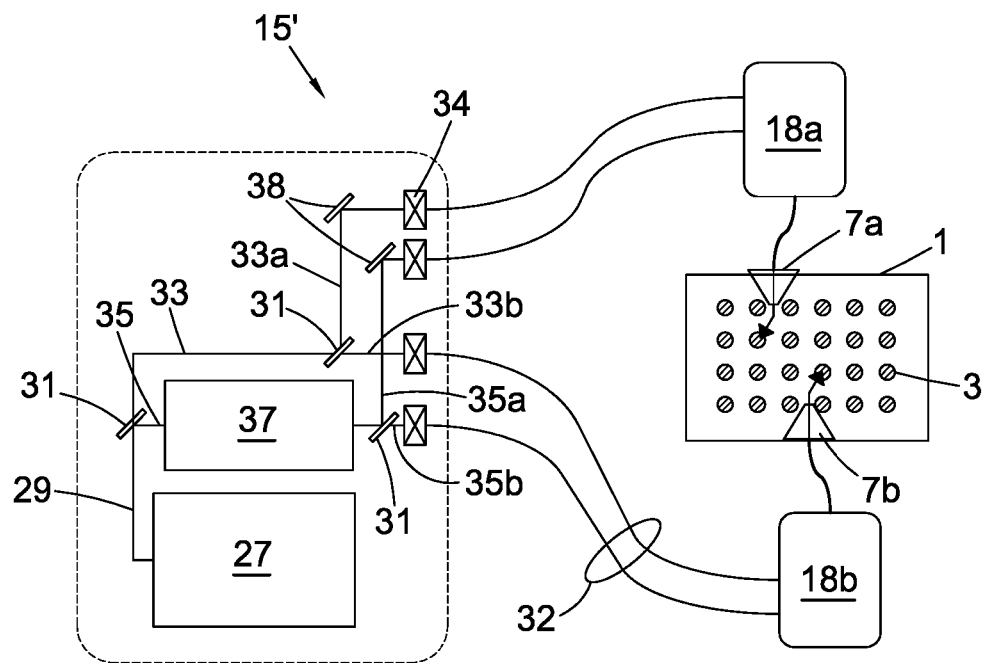
FIG. 5 is a schematic illustration of a portion of a test system which may form part of an alternative embodiment of the invention.

In some embodiments a DUT 1 may be tested using more than one probe 7 and more than one sampling module 18. FIG. 5 is a schematic illustration of a portion of a test system 15' which includes a first sampling module 18a and a second sampling module 18b. The first sampling module 18a is connected to a first probe 7a and the second sampling module 18b is connected to a second probe 7b. Both the first and second probes 7a, 7b are brought into contact with electrical contacts 3 on a DUT 1.

The first and second sampling modules 18a are provided with radiation emitted from a radiation source 27 (e.g. a laser). The radiation beam 27 emits a radiation beam 29 which is split into a generating beam 33 and a receiving beam 35 by a beam splitter 31. The receiving beam 35 is directed to a delay line 37 which is operable to introduce an optical delay between the generating and receiving beams 33, 35. The generating beam 33 is split into first and second portions 33a, 33b by a beam splitter 31. The receiving beam 35 is split into first and second portions 35a, 35b by a beam splitter 31. The first portion of the generating beam 33a and the first portion of the receiving beam 35a are provided to the first sampling module 18a. The first and second portions of the generating and receiving beams are coupled into optical fibres 32 by fibre couplers 34 and via mirrors 38. The second portion of the generating beam 33a and the second portion of the receiving beam 35a are provided to the second sampling module 18b.

In the arrangement which is shown in FIG. 5, the first and second sampling modules 18a, 18b are operated using common generating 33 and receiving beams 35. In such an arrangement it is possible for the sampling modules 18a, 18b to measure signals which are transmitted between the first and second probes 9A, 9B through the DUT 1, in addition to signal which is reflected in the DUT 1. A reflected signal may be separated from a transmitted signal by selectively turning off the generation of pulses at each sampling module 18a, 18b in turn. For example, the first sampling module 18a may initially generate signal pulses. The transmission of the pulses may be measured by the second sampling module 18b and the reflection of the pulses may be measured by the first sampling module 18a. Subsequently, the second sampling module 18b may generate signal pulses. The transmission of the pulses may be measured by the first sampling module 18a and the reflection of the pulses may be measured by the second sampling module 18b.

The measurements described above may be used to form a 2×2 matrix S which describes the coupling between two electrical contacts and is given by equation (1).

$$S = \begin{pmatrix} S_{11} & S_{12} \\ S_{21} & S_{22} \end{pmatrix} \quad (1)$$

The element $S_{11}$ represents a signal inserted at a first electrical contact and reflected back to the first electrical contact. The element $S_{22}$ represents a signal inserted at a second electrical contact and reflected back to the second electrical contact. The element $S_{12}$ represents a signal inserted at the first electrical contact and transmitted to the second electrical contact. The element $S_{21}$ represents a signal inserted at the second electrical contact and transmitted to the first electrical contact. The matrix S may be referred to as an S-parameter measurement or a scattering matrix of a DUT 1.

In some embodiments a test system may comprise more than two sampling modules and may simultaneously test a DUT 1 through more than two electrical contacts. In general an N×N S-parameter matrix may be derived by sampling a DUT 1 through N electrical contacts.

Whilst the embodiment which is shown in FIG. 5 includes a delay line 37, it will be appreciated that a delay between a generating 33 and receiving beam 35 may alternatively be introduced by using a dual-laser system as was described above. A first laser may emit a generating beam 33 and a second laser may emit a receiving beam 35. The first and second lasers may be synchronised and a synchronisation between the lasers controlled in order to control an optical delay between the generating and receiving beams.

As has been described above a DUT 1 may be tested through one or more probes 7, brought into contact with one of more electrical contacts using a variety of different methods. Signals are input into a DUT 1 and a reflection and/or transmission of the signal by the DUT 1 may be measured. In the following described embodiments, emphasis is placed on measurements of signal which is reflected by a DUT 1. However, it will be appreciated that similar principles apply to the measurement of transmitted signals. The following description may therefore equally apply to the measurement of transmitted signals as opposed to the measurement of reflected signals.

It may be desirable to test a DUT 1 through a plurality of different electrical contacts 3. This may be achieved by moving a probe 7 and/or the DUT 1 such that the probe ends 13, 15 contact different electrical contacts 3. At each position of the probe 7 and the DUT 1, signal pulses may be input into the DUT 1 through the probe 7 and signal reflections from the DUT 1 may be analysed at different delay times.

It is desirable to provide an automated or semi-automated test system which automatically moves a probe and/or a DUT 1 such that the probe ends contact different electrical contacts and the DUT 1 may be tested through the different electrical contacts. Providing an automated or semi-automated test system may greatly reduce the time required to test a DUT 1 (compared to, for example, manually moving the probe to contact electrical contacts). An automated or semi-automated test system may allow a DUT 1 to be rapidly tested through a plurality of electrical contacts 3. An automated or semi-automated test system may allow a plurality of devices 1 to be tested in quick succession.

Figure 6:
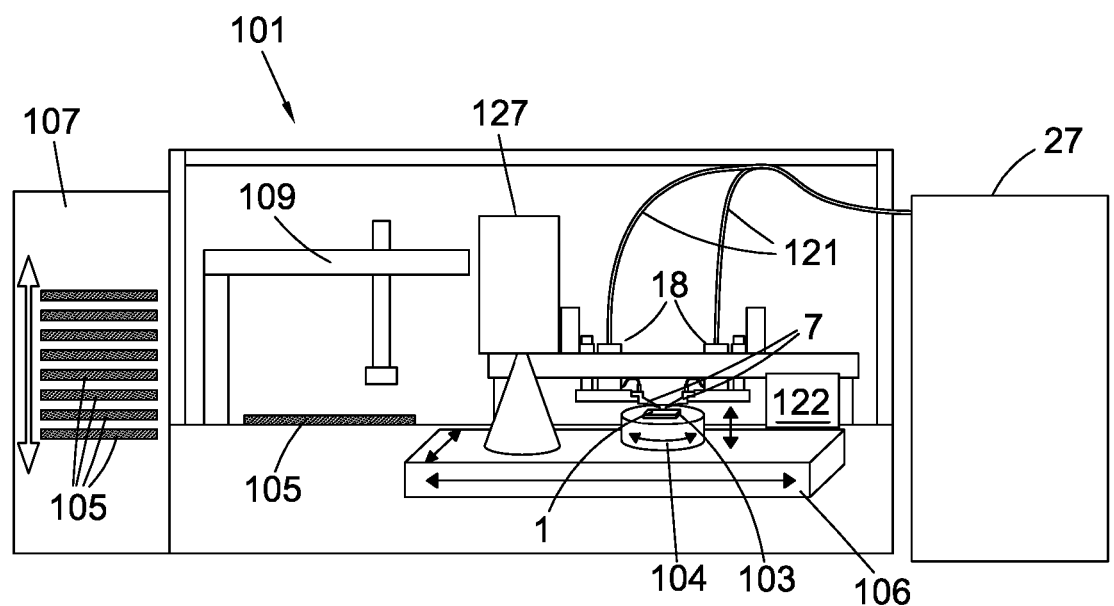
FIG. 6 is a schematic illustration of a test system according to an embodiment of the invention.

FIG. 6 is a schematic illustration of a test system 101 according to an embodiment of the invention. The test system comprises a device table 103 operable to hold at least one device 1. In some embodiments the device table 103 may be operable to hold a plurality of devices 1. The device table 103 is situated on a mount 104. The mount 104 is situated on a movement stage 106. A plurality of devices 1 may, for example, be held in trays 105. A plurality of trays 105 of devices 1 may be held in a tray holder 107. A tray 105 may be unloaded from the tray holder 107 in order to test one or more of the devices held on the tray 107 (as is shown in FIG. 6).

The test system 101 further comprises a loading device 109 operable to automatically load and unload devices 1 from the device table 103. For example, the loading device 109 may transfer a device 1 from a tray 105 and load the device 1 onto the device table 103. After the device 1 has been tested whilst being held on the device table 103, the device 1 may be unloaded from the device table 103 and returned to a tray 105.

Figure 7:
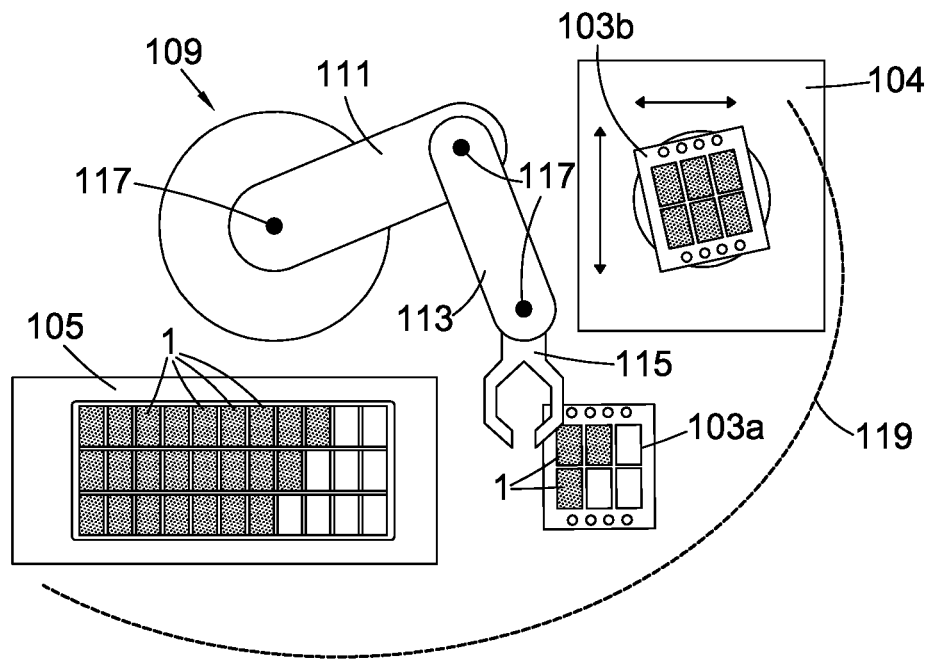
FIG. 7 is a schematic illustration of an embodiment of a loading device which may form part of the test system of FIG. 6.

FIG. 7 is a schematic illustration of an embodiment of a loading device 109. The loading device 109 comprises a robot having a first arm 111, a second arm 113 and an actuator 115 located at an end of the second arm 115. The first arm 111, the second arm 113 and the actuator 115 are rotatable about joints 117. Rotation of the first arm 111, second arm 113 and/or the actuator 115 about joints 117 allows the actuator 115 to be moved between components. The loading device 109 has an outer reach which is marked with a dashed line 119.

Also shown in FIG. 7 is a tray 105, a first device table 103a and a second device table 103b situated on a mount 104. The loading device 109 is operable to load devices 1 from the tray 105 and onto a device table 103. In the depiction shown in FIG. 7, the loading device 109 is in the process of loading devices 1 from the tray 105 and onto the first device table 103a. The loading device 109 may move a device 1 by moving the actuator 115 to a position to pick up a device 1. The actuator 115 may then clasp the device 1 which may be moved with the actuator 115 to a different location for unloading.

In the embodiment which is shown in FIG. 7, the device tables 103a, 130b are each operable to hold six devices. Once a device table 103 has been loaded with devices 1, the device table 103 may be loaded onto the mount 104 where the devices 1 may be tested. A device table 103 may, for example, be moved and loaded onto the mount 104 by the loading device 109. As is shown in FIG. 7 a first device table 103a may be loaded with devices whilst a second device table 103b is situated on the mount 104 and the devices 1 on the second device table 103b are tested. This may improve the throughput of the test system 101. The throughput of a test system may be considered to be a number of devices which are tested per unit time.

Returning again to FIG. 6, the test system 101 which is shown in FIG. 6, further comprises a pair of probes 7. Whilst not shown in detail in FIG. 6, the probes 7 may be similar to the embodiments of probes which were described above with reference to FIG. 6. Each probe is connected to a sampling module 18. The sampling modules 18 are operable to input signal pulses into a DUT 1 through a probe 7 and receive signal reflections from the DUT 1, as was described above with reference to FIG. 4. The sampling modules 18 of the embodiment of FIG. 6 may be similar to the sampling module 18 described above with reference to FIG. 4 and may have any of the features of a sampling module described herein.

In the embodiment which is shown in FIG. 6, the sampling modules are coupled to optical fibres 121 which are coupled at their other ends to a radiation source 27. As was described above with reference to FIG. 4, the radiation source 27 emits pulses of radiation which may be directed to be incident on photoconductive elements which form part of the sampling modules 18. Whilst not shown in FIG. 6, the test system 101 may further comprise one or more delay lines configured to introduce optical delays between pulses of radiation emitted from the radiation source 27. The operation of the radiation source 27 and the sampling modules 18 will not be described in any more detail with reference to FIG. 6. As was described above alternative embodiments of a sampling module and/or a radiation source may be used.

The probes 7 may be brought into contact with electrical contacts 3 (not shown in FIG. 6) on a DUT 1 through probe ends 13, 15 (not shown in FIG. 6) of the probe 7. The test system 101 comprises a movement mechanism 122 which is operable to move one or both of a device table 103 and a probe 7 so as to bring the probe ends 13, 15 into contact with at least two electrical contacts 3 on a DUT 1. The movement mechanism is only shown schematically as a box 122 in FIG. 6, since it may take a variety of different forms and may comprise multiple components which are not shown in detail.

The movement mechanism 122 may, for example, comprise one or more actuators configured to move components of the test system 101. For example, one or more actuators may be configured to move a probe 7 so as to bring probe ends 13, 15 on the probe 7 into contact with electrical contacts 3 on a DUT 1. Additionally or alternatively one or more actuators may be configured to directly move a device table 103 on which a DUT 1 is situated. Additionally or alternatively one or more actuators may be configured to move a mount 104 on which a device table 103 holding a DUT 1 is situated. Additionally or alternatively one or more actuators may be configured to move a movement stage 106 on which a mount 104 is situated. The movement mechanism may be operable to translate and/or rotate one or more components (e.g. a device table 103 and/or a probe 7). The movement mechanism may be operable to adjust the position and/or the orientation of one or more components (e.g. a device table 103 and/or a probe 7).

It will be appreciated that in order to bring probe ends 13, 15 of a probe 7 into contact with electrical contacts 3 of a DUT 1 it is desirable to know the position of the electrical contacts 3 to be contacted relative to the position of the probe ends 13, 15. Knowledge of these positions allows a required movement of the probe 7 and/or a device table 103 on which the DUT 1 is situated, in order to contact the electrical contacts, to be determined. However, the position, size and/or shape of the electrical contacts 3 on a DUT 1 may be different for different devices and may not be known prior to testing the device.

Figure 8:
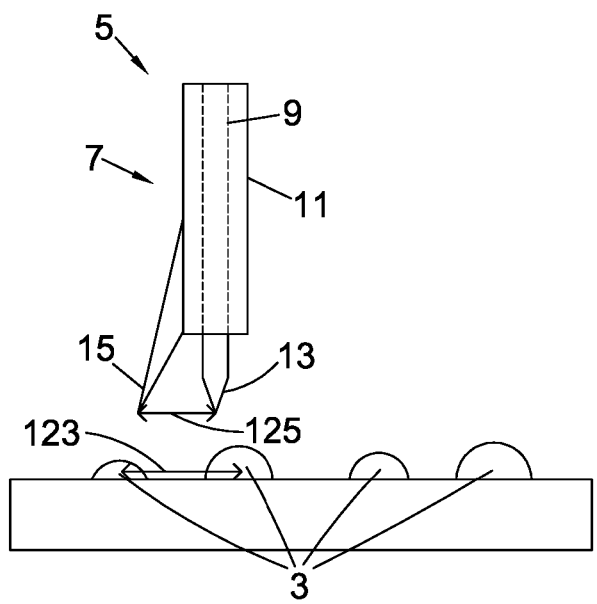
FIG. 8 is a schematic illustration of a portion of an electronic device shown in cross-section.

FIG. 8 is a schematic illustration of a portion of a DUT 1 in cross-section. The DUT 1 includes a plurality of electric contacts 3 (which are shown as ball-type electrical contacts in FIG. 8). Also shown in FIG. 8 is a probe 5 which may be used to contact the electrical contacts 3. The probe 7 which is shown in FIG. 8 is the same as the probe 7 which was described above with reference to FIG. 2 and will not be described here in any more detail.

As can be seen in FIG. 8, the electrical contacts 3 do not all have the same size and shape. Furthermore, a pitch 123 between adjacent electrical contacts 3 is not consistent for each of the electrical contacts 3. The pitch 123 between adjacent contacts 3 may not match a pitch 125 between the probe ends 13, 15 of a probe 7. Finding a position and orientation of the probe 7 relative to the DUT 1 at which the probe ends 13, 15 simultaneously contact two electrical contacts of the DUT 1 may not therefore be trivial. For example, the probe 7 may be tilted with respect to the DUT 1 in order to simultaneously contact two electrical contacts 3. An angle with which the probe 7 is tilted with respect to the DUT 1 may be different for contacting different electrical contacts 3.

In order to bring probe ends 13, 15 into contact with electrical contacts of a DUT 1, a configuration of the movement mechanism 122 may be determined, which achieves the contact. The movement mechanism 122 is operable to move one or both of a device table 103 and a probe 7 so as adopt the determined configuration in which probe ends 13, 15 of the probe 7 are in contact with electrical contacts 3 on a DUT 1. References herein to movement of a device table 103 may comprise direct movement of the device table 103 or may comprise movement of another component on which the device table 103 is situated. For example, movement of a mount 104 on which a device table 103 is situated is an example of movement of a device table 103. Similarly, movement of a movement stage 106 on which a device table 103 is situated is a further example of movement of a device table 103.

In order to determine a configuration of the movement mechanism 122 which brings probe ends 13, 15 of a probe 7 into contact with electrical contacts 3 of a DUT 1 it is desirable to acquire knowledge of the position, size and/or shape of the electrical contacts of a DUT 1. Referring again to FIG. 6, the test system 101 further comprises a profile determining system 127. The profile determining system 127 is configured to determine a profile of the electrical contacts of a device. For example, the profile determining system may be configured to determine a three-dimensional profile of the electrical contacts of a device. The determined profile of the electrical contacts is subsequently used to determine a configuration of the movement mechanism 122 which brings probe ends 13, 15 of a probe 7 into contact with electrical contacts 3 of a DUT 1.

Figure 9A:
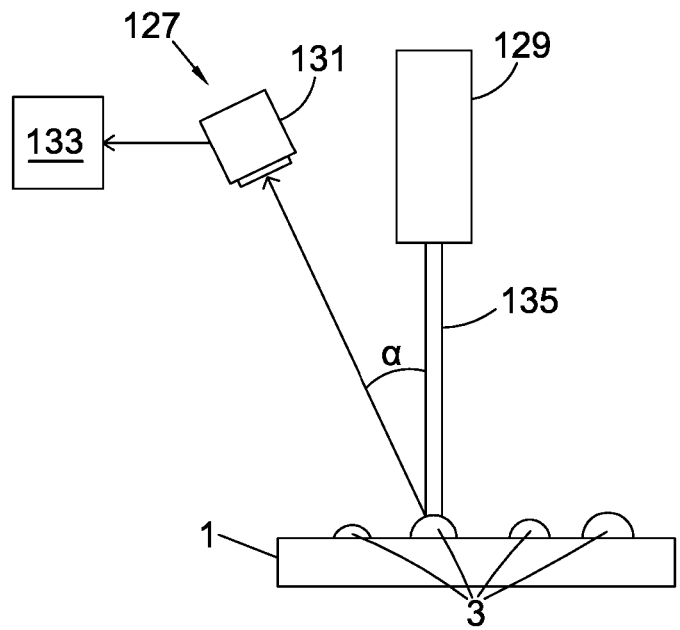
FIGS. 9A and 9B are schematic illustrations of an embodiment of a profile determining system which may form part of the test system of FIG. 6.
Figure 9B:
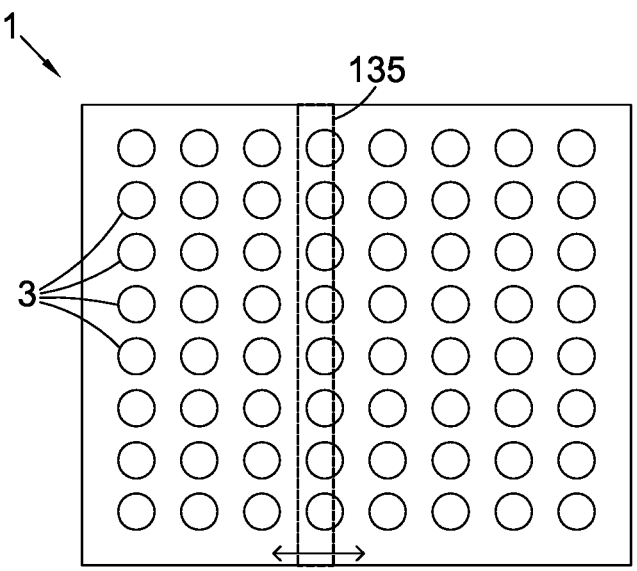

An embodiment of the profile determining system 127 is shown in further detail in FIG. 9. FIG. 9A is a schematic illustration of an embodiment of a profile determining system 127 as viewed from the side. FIG. 9B is a schematic illustration of a device 1 as viewed from above, where the device 1 is illuminated by a strip of radiation by the profile determining system 127.

The profile determining system 127 comprises a radiation source 129, a radiation sensor 131 and a controller 133. The radiation source 129 is configured to illuminate at least a portion of a device under test with radiation 135. In the embodiment which is shown in FIG. 9, the radiation source 129 is configured to illuminate a strip of a device 1 with a strip of radiation 135. The radiation sensor 131 is configured to detect radiation which is scattered from the device 1. For example, the radiation sensor 131 may detect radiation which is scattered from electrical contacts 3 on the device 1. The controller is configured to determine from the detected scattered radiation a profile (e.g. a three-dimensional profile) of the electrical contacts of the device 1.

The radiation source 129 may, for example, comprise one or more light emitting diodes (LEDs). In some embodiments the radiation source 129 may comprise a laser. However, lasers typically emit coherent radiation. Coherent radiation which is scattered from a device 1 may form interference patterns (for example, a speckle pattern) which may be viewed by the radiation sensor 131 and may effect measurements made by the radiation sensor 131. The radiation which is emitted from an LED is typically less coherent than radiation which is emitted from a laser. Consequently, the use of one or more LEDs advantageously reduces the impact of any interference effects on the measurements made by the radiation sensor 131.

The radiation sensor 131 may, for example, comprise a camera. In the embodiment which is shown in FIG. 9, the radiation sensor 131 is orientated at an oblique angle $\alpha$ with respect to the direction of propagation of radiation 135 emitted from the radiation source 129. The radiation sensor 131 is arranged such that different parts of the device 1 having different heights appear at different positions in a field of view of the radiation sensor 131. The controller 133 may determine from the positions in the field of view of the radiation sensor in which scattered radiation appears, the position on the device 1 from which radiation is scattered. This may allow the position and/or the shape of scattering surfaces of the device under test to be determined.

As was described above, in the embodiment which is shown in FIG. 9, the radiation source 129 is configured to illuminate a strip of a device 1 with a strip of radiation 135. The radiation sensor 131 is configured to detect radiation scattered from the device 1 (e.g. from the electrical contacts of the device 1) which lie within the strip of radiation. The controller 133 is configured to determine the height of points of the device which lie within the illuminated strip of the device 1.

The strip of radiation 135 may be scanned over the device 1 as indicated by the double headed arrow in FIG. 9B. For example, the movement mechanism 122 may move one or both of a device table 103 on which the device 1 is situated and the radiation source 129 so as to scan the strip of radiation 135 over the device 1. At each position of the strip of radiation 135 on the device 1, the controller 133 determines the height of points of the device 1 which lie within the strip of radiation 135. The controller 133 combines the determined heights of the device 1 at different positions of the strip of radiation 135 so as to determine a three-dimensional profile of the device 1. A profile of the device 1 includes a profile of the electrical contacts 3 on the device 1.

In some embodiments the radiation source 127 and the radiation sensor 131 may be arranged such that specular reflections from electrical contacts 3 are received at the radiation sensor 131. This may increase a detection signal which is received at the radiation sensor 131 and may therefore improve the accuracy of the profile determination. Such an embodiment may be particularly applicable for profiling a device which includes a land-grid array (LGA) of electrical contacts 3. Electrical contacts 3 which form a land-grid array may have relatively small heights when compared to other forms of electrical contacts. The profiles of an LGA may therefore be difficult to detect. Detecting specular reflections from an LGA may improve the accuracy with which the LGA is profiled.

In some embodiments, a profile determining system 127 may include a plurality of radiation sources 127. A first radiation source may be orientated such that specular reflection from electrical contacts 3 is received at the radiation sensor 131. The first radiation source may be used for profiling devices 1 which include an LGA. A second radiation source may be orientated such that diffusely scattered radiation is received at the radiation source rather than specular reflection. The second radiation source may be used for profiling devices which do not include an LGA.

In other embodiments, a profile determining system 127 may determine a profile of electrical contacts 3 on a DUT 1 by different means than those described above with reference to FIG. 9. For example, the profile determining system 127 may comprise a camera which acquires an image of a DUT 1 from above. Image processing may be performed on the acquired image in order to detect the position of electrical contacts 3 in the image. In some embodiments two-dimensional information about the position of the electrical contacts 3 may be combined with information acquired from one or more additional sensors configured to provide information about the height of the DUT 1.

In some embodiments, the height of an electrical contact 3 on a DUT 1 may be determined by illuminating the electrical contact 3 with a radiation beam and measuring the return time of radiation reflected from the electrical contact 3. The return time may be used to determine the height of an electrical contact 3. For example, the profile determining system 127 may comprise a laser configured to illuminate a portion of a DUT 1 with a laser beam and a radiation sensor arranged to measure the return time of reflected laser radiation from the DUT 1. A controller may determine the height of a point on the DUT 1 based on the return time. The laser and/or the DUT 1 may be moved so as to illuminate different positions on the DUT 1 and determine the height of the DUT 1 at the different positions. The determined height of the DUT 1 at different positions on the DUT 1 may be combined to form a profile of the DUT 1 which includes a profile of the electrical contacts 3 on the DUT 1.

In some embodiments, information relating to the height of the DUT 1 at different positions (e.g. acquired using a laser as described above) may be combined with information derived from an acquired image of the DUT 1. For example, an image of the DUT 1 from which the position of electrical contacts 3 on the DUT 1 may be derived, may be combined with height information in order to determine a profile of the electrical contacts 3 on the DUT 1.

Whilst embodiments have been described in which a three-dimensional profile of electrical contacts of a DUT 1 may be determined, in some embodiments a two-dimensional profile may be sufficient. For example, if a DUT 1 were to comprise a plurality of electrical contacts 3 arranged in a line, it may be sufficient to determine the height of the electrical contacts 3 as a function of position along the line, thereby determining a two-dimensional profile of the electrical contacts 3. In embodiments in which the DUT 1 includes a more complicated arrangement of electrical contacts 3 it is desirable to determine a three-dimensional profile of the electrical contacts 3.

In order to determine a configuration of the movement mechanism 122 which brings probe ends 13, 15 of a probe 7 into contact with electrical contacts 3 of a DUT 1, it is desirable to know the position of the profile of the DUT 1 relative to the position of the probe 7. In some embodiments, this may be achieved by determining the position of the profile of the DUT 1 relative to a device table 103 on which the DUT 1 is held. The position of the probe 7 relative to the device table 103 may also be determined, thereby providing the position of the profile of the DUT 1 relative to the position of the probe 7.

References made herein to the position of an element relative to the position of another element are intended to include the relative orientations of the two elements. For example, determining the position of a probe 7 relative to device table 103 may include determining the relative orientations of the probe 7 and the device table 103.

Figure 10:
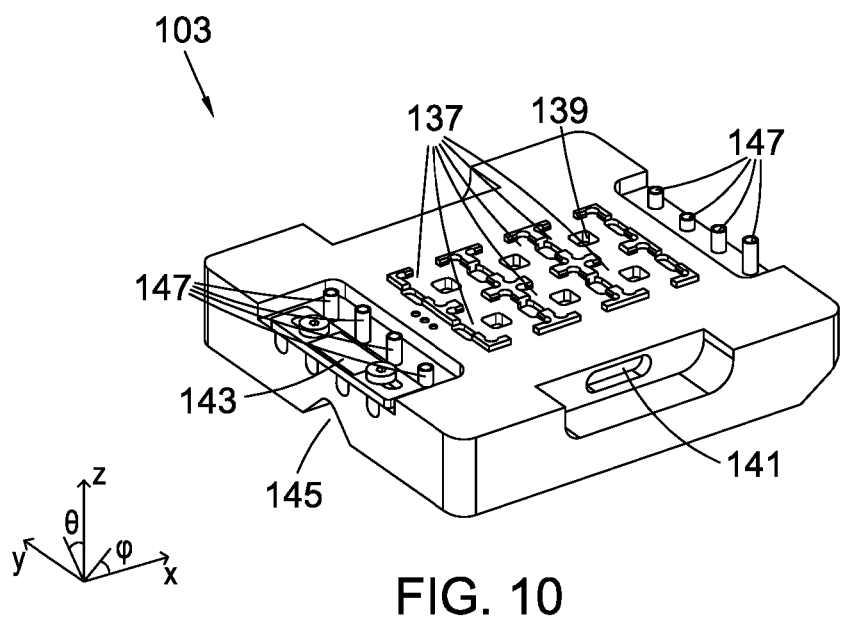
FIG. 10 is a schematic illustration of a device table which may form part of the test system of FIG. 6.

FIG. 10 is schematic illustration of a device table 103. Also shown in FIG. 10 is a co-ordinate system which may be used to describe the position and orientation of the device table 103. The device table 103 may be translated in x, y and z directions and may be rotated with respect to the x-axis by an azimuthal angle $\varphi$ and with respect to the z-axis by a polar angle $\theta$.

The device table 103 includes device mounting locations 137 at which devices 1 may be mounted on the device table 103. In the embodiment which is shown in FIG. 10, the device table 103 includes six device mounting locations 137. In other embodiments a device table 103 may include more than or fewer than six device mounting locations 137.

Devices 1 may be held in position on the device table by vacuum clamping the devices 1 to the device table 103. In the embodiment of FIG. 10, the device mounting locations 137 are provided with vacuum ports 139 which are operable to apply a vacuum to the underside of a device so as to clamp the device 1 to the device table 103.

The device table 103 which is shown in FIG. 10, includes gripping locations 141. Gripping locations 141 provide contact points at which the device table 103 may be gripped in order to hold and move the device table 103. For example, the actuator 115 of the loading device 109, which is shown in FIG. 7 may grip the device table 103 at gripping locations 141.

The device table 103 further includes a shorting pad 143, which provides a location at which components may be shorted together. For example, two probe ends 13, 15 may both be brought into contact with the shorting pad 143 so as to short them together. This may allow one or more reference measurements to be taken. For example, a measurement of reflection of signal from a shorted probe end may be taken as a reference measurement. Another reference measurement may be taken when the probe ends 13, 15 are not shorted together. The shorting pad 143 may, for example, be gold plated.

The underside of the device table 103 includes mounting points 145. The mounting points 145 may be configured to interface with a mount 104 on which a device table 103 may be positioned. The mount 104 may comprise a kinematically constrained mount. Embodiments of a mount 104 on which the device table 103 may be positioned are described in further detail below with reference to FIG. 12.

The device table 103 further comprises reference structures 147. The reference structures 147 may, for example, be fitted into holes in a device table 103. The reference structures 147 provide reference points at positions on the device table 103, which may be known. The reference structures 147 may provide reference positions on the device table 103 against which the profile of the electrical contacts 3 on a DUT 1 may be measured. For example, the profile determining system 127 may determine a profile of the device table 103, which includes a profile of electrical contacts 3 on a DUT 1 located on the device table, and may also include a profile of the reference structures 147 on the device table 103. The reference structures 147 may be identified in the determined profile. Since the reference structures 147 may be located at known positions on the device table 103, identifying the reference structures 147 in a determined profile of the device table 103 may allow the positions of electrical contacts 3 on a DUT 1 positioned on the device table 103 to be determined. The determined position of electrical contacts 3 on a device table 103 may allow the position to which a probe 7 should be moved relative to the device table 103 in order to contact the electrical contacts 3 to be determined.

The reference structures 147 may extend out of the device table 103 (as is shown in FIG. 10). In alternative embodiments, the reference structures 147 may extend into the device table 103 (e.g. the reference structures may be recessed into the device table 103). In the embodiment which is shown in FIG. 10, the reference structures 147 are situated on a different vertical level (i.e. at a different position on the z-axis shown in FIG. 10) to the level on which devices 1 are supported. The device mounting locations 137 which are configured to support devices 1 may lie substantially in a supporting plane. In the embodiment which is shown in FIG. 10, the reference structures 147 extend out of a plane which is substantially parallel with the supporting plane. In other embodiments, the reference structures 147 may extend out of the supporting plane. The reference structures 147 may extend in a direction which is perpendicular to the supporting plane (as is shown in FIG. 10).

At least two of the reference structures 147 may extend out of or into the device table 103 by different distances. For example, in some embodiments all of the reference structures may extend out of or into the device table 103 by different distances. The distance with which a reference structure 147 extends out of or into the device table 103 may be referred to as the height of the reference structure 147. The distance with which a reference structure 147 extends out of or into the device table may be taken to be a distance in a direction which is normal to the supporting plane. In the embodiment of FIG. 10, the distance with which a reference structure 147 extends out of the device table 103 may be taken to be the distance which a reference structure 147 extends out of a plane which is substantially parallel with the supporting plane. In embodiments in which the reference structures 147 extend out of the supporting plane, the distance may be taken to be a distance which a reference structure 147 extends out of the supporting plane.

Reference structures 147 which extend out of or into the device table 103 by different distances advantageously increase the accuracy with which the position of features (e.g. electrical contacts 3 on a DUT 1) can be determined relative to the reference structures 147. In some embodiments, the reference structures may all extend out of or into the device table 103 by approximately the same distance. However, in such embodiments accurately contacting electrical contacts 3 which are positioned at different heights may rely on the accuracy and linearity of the profile determining system 127. By positioning reference structures 147 at different heights (i.e. extending out of or into the device table 103 by different distances) references may be taken at different heights. This may allow any non-linearity or scaling error in the profiling determining system 127 to be compensated for and the accuracy with which electrical contacts 3 located at different heights are contacted may be improved.

In order to accurately determine the position of a profile of electrical contacts 3 on a DUT 1 with respect to the device table 103 it may be preferable to provide at least three reference structures 147 on the device table 103. In some embodiments more than three reference structures 147 may be provided. For example, in the embodiment of FIG. 10, eight reference structures 147 are provided.

Figures 11A, 11B, 11C:
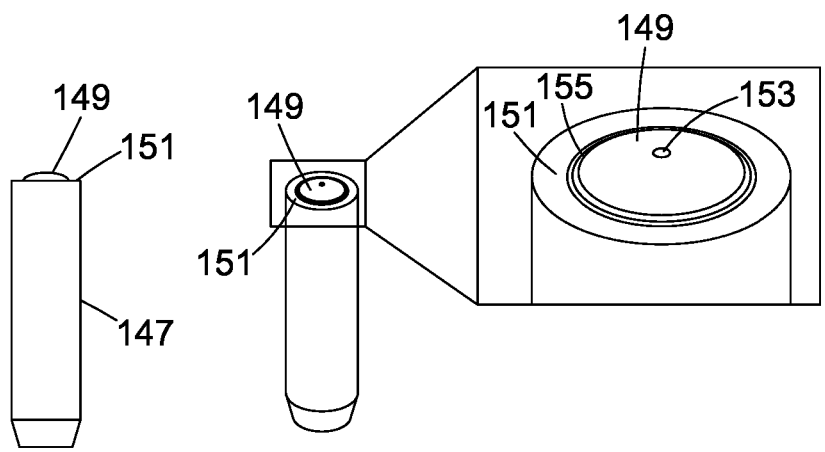
FIGS. 11A, 11B and 11C are schematic illustrations of a reference structure which may form part of the device table of FIG. 10.

FIG. 11 shows an embodiment of a reference structure 147 in more detail. FIG. 11A is a schematic illustration of a side view of a reference structure 147. FIG. 11B is a schematic illustration of the reference structure 147 shown in perspective. FIG. 11C is a schematic illustration of an end of the reference structure 147 in more detail.

The reference structure 147 comprises a pillar shaped structure. The pillar may, for example, have a diameter of about 2-3 mm. The reference structure 147 includes a substantially spherically shaped tip portion 149. The spherically shaped tip portion 149 is surrounded by a substantially flat rim 151. The spherically shaped tip portion 149 and the substantially flat rim 151 provide features which are easily identifiable in a determined profile of the device table 103. For example, the spherically shaped tip potion 149 and the substantially flat rim 151 may be relatively easy to fit a geometric function to in the profile data. The position of the reference structures 147 with respect to other features in a determined profile (e.g. electrical contacts 3 on a DUT 1) may therefore be easily identified.

The reference structure 147 may comprise other features which improve the visibility of the reference structures 147 to a profile determining system 127. For example, a profile determining system 127 which measures radiation which is scattered from an object at oblique angles (e.g. the profile determination system 127 which is shown in FIG. 9) may work particularly well when profiling objects which scatter a relatively large amount of radiation diffusely from a surface to be profiled. The reference structures 147 may be provided with roughness features on small scales which serve to increase diffuse scattering of radiation from the reference structure 147. For example, a reference structure 147 may be provided with roughness features on a scale of about 50 microns or less. This may improve the visibility of the reference structure 147 to a profile determining system 127.

In some embodiments, a reference structure 147 may be provided with ridges in the surface of the reference structure 147. The ridges may, for example, be separated by approximately 40 microns. Ridges may be considered to be an example of roughness features.

The reference structure 147 which is shown in FIG. 11 includes a reference feature 153. The reference feature 153 marks a reference point at which a probe end may be brought into contact with the reference structure 147. The reference feature may have a dimension which is approximately equal to the size of a probe end 13, 15. Any reference which is made herein to a reference feature 153 having a dimension which is approximately equal to the size of a probe end 13, 15 should be interpreted to mean that the reference feature 153 has a dimension which is of the order (or is comparable to) the size of a probe end 13, 15. It should be appreciated that a reference feature 153 having a dimension which is approximately equal to the size of a probe end 13, 15 should not be limited to a feature which has exactly the same size. As will be described in further detail below, a reference feature 153 is intended as a point to which a probe end may be brought in order to perform a calibration of the position of the probe 7 relative to the device table 103. The degree to which the reference feature 153 and the probe end 13, 15 have the same size may be determined by a required accuracy of the calibration.

In the embodiment which is shown in FIG. 11, the reference feature 153 comprises a groove in the reference structure. The groove is substantially circular and extends around an apex of the reference structure 149. The groove 149 may, for example, have a diameter of approximately 150 microns. The depth of the groove may be approximately 10 microns. In some embodiments a reference feature 153 may comprise a plurality of circular grooves of different sizes, each groove extending around an apex of the reference structure 147. In other embodiments a reference feature 153 may comprise a laser etched mark on the reference structure 147, cross-hairs marked on the reference structure 147 (e.g. a pair of grooves forming a cross-hairs) or may be some other feature. In general, a reference feature 153 may comprise any feature, which is resolvable by inspection (either direct visual inspection or by inspection through an inspection instrument (e.g. a camera or microscope)). This allows a probe end to be guided into contact with a reference point, which is marked by the reference feature 153.

As was alluded to above, a reference feature 153 may be used in a calibration of the position of a probe 7 with respect to the device table 103. As was explained, above the position of electrical contacts 3 on a DUT 1 held by the device table 103 is determined with respect to reference structures 147 on the device table 103 by the profile determining system 127.

In order to determine, a configuration of the movement mechanism 122 which results in contact of the probe ends 13, 15 with electrical contacts of a DUT 1 it is desirable to accurately calibrate the movement mechanism 122 which determines the position of the probe 7 with respect to the device table 103.

The movement mechanism 122 may be calibrated by bringing a probe 7 into contact with a reference structure 147. Since the position of the reference structure 147 on a device table 103 is known, bringing the probe 7 into contact with a reference structure 147 provides a known position of the probe 7 which may be used to calibrate the movement mechanism 122. In order to increase the accuracy of the calibration a probe end 13, 15 may be brought into contact with the reference structure 147 at or near to a reference point which is marked by a reference feature 153 on the reference structure 147. As was described above, a reference feature 153 may have a size which is comparable to the size of a probe end 13, 15. A reference feature 153 therefore provides a more precise reference point to which a probe end may be accurately moved. For example, a probe end 13, 15 may be moved to contact a reference structure within the circular groove 153 shown in FIG. 11C.

The reference feature 153 may, for example, surround an apex of the reference structure 147. For example, in embodiments in which the reference feature 153 comprises a circular groove in the reference structure, the circular groove may extend around an apex of the reference structure 147 (as is shown in FIG. 11C). The reference feature 153 marks a reference point which lies substantially at the apex of the reference structure 147 and within the bounds of the circular groove. A probe end may be brought into contact with the apex of the reference structure (i.e. the reference point).

The reference feature 153 may be provided on a convex or protruding surface of the reference structure 147. This may reduce the chances of a probe end being unintentionally brought into contact with other regions of the reference structure 147.

In some embodiments, the movement mechanism 122 may be operated manually in order to bring a probe end 13, 15 into contact with a reference structure. That is, the configuration of the movement mechanism 122 may be adjusted by a person until a probe end 13, 15 contacts the reference structure 147. A test system 101 may comprise a calibration system which allows a determination of the position of a probe end 13, 15 relative to a reference structure 147. The calibration system may, for example, comprise a camera or a microscope through which a probe end 13, 15 and a reference structure 147 may be viewed. The movement mechanism 122 may be adjusted by an operator whilst viewing the probe end 13, 15 and the reference structure 147 through the calibration system. The movement mechanism 122 may be adjusted until the probe end 13, 15 contacts the reference structure 147 (e.g. at or near to a reference point marked by the reference feature 153).

This provides a reference of a known configuration of the movement mechanism 122 which results in a known position of the probe 7 relative to the device table 103. This may allow other configurations of the movement mechanism 122 which result in other positions of the probe 7 relative to the device table 103 to be determined. With knowledge of the positions of the electrical contacts 3, relative to the device table 103, the probe 7 may then be accurately moved to contact desired electrical contacts 3. In some embodiments, a reference feature 153 on a reference structure 147 may be detected by the profile determining system 127. The position of a reference feature 153 which is used during a calibration of the movement mechanism 122 may therefore be detected in a profile of electrical contacts 3 of a DUT 1. This may improve the accuracy with which the position of electrical contacts 3 is determined with respect to the position of the probe 7.

In some embodiments, multiple probe ends 13, 15 of a probe 7 may be brought into contact with a reference structure 147 at different times, in order to provide further reference configurations of the movement mechanism 122 and improve the accuracy of the calibration. A probe 7 may be moved so as to contact a plurality of different reference structures 147 at different times, further improving the calibration. In order to accurately calibrate the movement mechanism in all directions it is desirable for a probe 7 to be brought into contact with reference structures 147 which are located at different positions in the x, y and z directions.

A probe end 13, 15 may be brought to contact a reference structure 147 in a plurality of different orientations. For example, the probe 7 may be rotated (e.g. by changing the angle θ which the probe forms with the z-axis and/or changing the angle φ which the probe forms with the x-axis) to different orientations (e.g. 4 or more different orientations) whilst contacting a reference structure 147. The different orientations of the probe 7 may provide further reference positions which may improve the calibration of the movement mechanism.

Embodiments have been described above in which a calibration system configured to allow a determination of the position of a probe end relative to a reference structure 147 comprises a camera or a microscope through which the probe end and the reference structure 147 may be viewed. In some embodiments, a calibration system may comprise other components. For example, the calibration system may comprise a profile determination system 129, the profile determination system 129 may determine the profile of a reference structure 147 and a probe end, as the probe end is brought towards the reference structure 147. This may allow an operator to determine the position of the probe end relative to the reference structure 147 and bring the probe end into contact with the reference structure 147.

In some embodiments, the calibration system may comprise means for detecting contact between a probe end and a reference structure. For example, the calibration system may comprise an electrical continuity tester which detects electrical continuity between a probe end and a reference structure. The calibration system may comprise one or more pressure sensors on a probe and/or a reference structure which are configured to detect contact between the probe end and the reference structure.

The calibration of the movement mechanism 122 may be updated without the need to bring a probe end 13, 15 into contact with a reference structure 147. For example, in some embodiments, the calibration of the movement mechanism 122 may be updated when a probe 7 is brought into proximity with electrical contacts 3 of a DUT 1 (e.g. during testing of the DUT 1). The profile determining system 129 may determine a profile of the probe ends 13, 15 of a probe 7 and the profile of electrical contacts 3 which the probe ends 13, 15 are in proximity of. The determined profile may be used to determine the position of the probe ends 13, 15 in relation to the electrical contacts 3. This may be used to determine the accuracy of the current calibration of the movement mechanism 122 and the calibration may be updated if required. The calibration of the movement mechanism 122 may, for example, be updated after a probe 7 has been replaced by a new probe 7.

Figure 12:
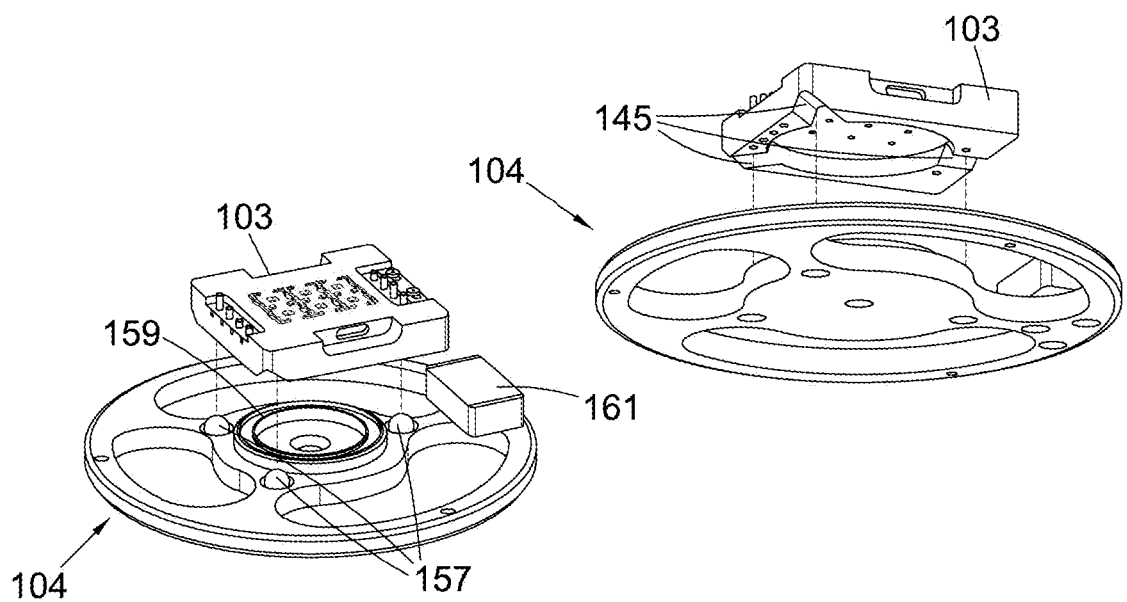
FIG. 12 is a schematic illustration of an embodiment of a mount which may form part of the test system of FIG. 6.

FIG. 12 is a schematic illustration of an embodiment of the mount 104 shown in two perspective views. Also shown in FIG. 12 is a device table 103 which may be positioned on the mount 104. The mount 104 is a kinematically constrained mount which constrains the movement of the device table 103 in a plurality of degrees of freedom. For example the kinematically constrained mount 104 may constrain the movement of the device table 103 in all six degrees of freedom. Constraining the movement of the device table 103 allows the device table 103 to be moved in a repeatable and controlled manner which allows for accurate positioning of the device table 103. In some embodiments the device table 103 may be held in a fixed position on the mount 104 and a probe 7 may be moved around the device table 103 to contact different elements on the device table 103.

The mount 104 comprises ball supports 157 which fit into the mounting points 145 located on the underside of the device table 103. The mounting points 145 comprise v-shaped grooves in which the ball supports 157 sit. The ball supports 157 may slide along the groove shaped mounting points 145 so as to adjust the orientation of the device table 103 with respect to the mount 104. Each ball support 157 has two contact points with the groove shaped mounting points 145 in which the ball support 157 sits. With three mounting points 145 and three ball supports 157 there is a total of six contact points. Each surface contact point may have a unique normal direction. The combination of the six contact points serves to constrain the movement of the device table 103 in 6 degrees of freedom.

The mount 104 further comprises a vacuum seal 159. The vacuum seal 159 may allow the device table 103 to be vacuum clamped to the mount 104. In other embodiments, a device table 103 may be clamped to the mount 104 using a different clamping mechanism. For example, a device table 103 may be magnetically, electrostatically, or mechanically clamped to the mount 104. The vacuum seal may allow a vacuum pump to be fluidly connected with the vacuum ports 139 on the device table 103 through the mount 104.

The mount 104 further comprises a cleaning pad 161. The cleaning pad 161 provides a surface on which probe ends 13, 15 of a probe 7 may be cleaned. For example, the movement mechanism 122 may drag probe end 13, 15 over the cleaning pad 161 which may act to remove dirt, solder oxide or any other deposits from the probe ends 13, 15.

An embodiment of a test system 101 has been described above which is configured to determine a profile of electrical contacts 3 on one or more devices 1, prior to contacting the electrical contacts 3 with a probe 7. The profiling and probing of a device may be performed in sequential stages. For example a device table 103 on which one or more devices 1 are held may initially be profiled using a profile determination system 127. Subsequently the device table 103 may be moved to a probing stage where one or more probes 7 are brought into contact with electrical contacts 3 on DUTs 1 situated on the device table 103. The DUTs 1 may then be tested using the one or more probes 7. The profile of the device table 103 which is acquired during the profiling stage is used to determine configurations of the movement mechanism 122 to be used during the probing stage in order to contact electrical contacts 3 on devices 1 on the device table 103

In order to improve the throughput of a test system 101 a first device table 103 may be profiled whilst devices 1 on a second device table 103 are probed. Once the first device table 103 has been profiled it may then be moved to a probing stage in order for the devices 1 on the first device table 103 to be probed. Whilst devices 1 on the first device table 103 are being probed, a third device table 103 may be profiled in preparation for probing of devices 1 on the third device table 103.

The test system 101 of FIG. 6 includes a movement stage 106. The movement stage may, for example, be a linear movement stage 106 which is operable to move device tables 103 between a profiling stage and a probing stage.

After a device table 103 has been profiled by the profile determination system 127, configurations of the movement mechanism 122 to be used during a probing stage are determined (e.g. by a controller). During a probing stage the movement mechanism 122 may move one or both of a device table 103 and a probe 7 to a plurality of different positions and/or orientations so as to bring probe ends 13, 15 of the probe 7 into contact with a plurality of different electrical contacts 3, on DUTs 1 situated on the probe table 103.

Prior to the probing stage a sequence of configurations of the movement mechanism may be determined which seeks to contact each of the electrical contacts to be tested in the shortest possible time. For example, a global search of possible movement mechanism sequences may be performed in order to find a sequence which minimises the time required to perform the probing stage. An algorithm such as a genetic algorithm or a simulated annealing algorithm may be used to search for an optimum sequence of movement mechanism configurations.

Some forms of movement of a probe 7 and/or a probe table 103 may be performed faster than other forms of movement. For example, rotation of a probe 7 may take longer to perform than a translation of the probe 7. Solutions may therefore be sought which include a small number of rotations of the probe 7 during the probing stage. For example, solutions may be searched for in which the total number of different angular orientations of a probe 7 during a probing stage is relatively small.

There may be some orientations of a probe 7 relative to a probe table 103 which achieve contact with electrical contacts in an undesirable manner. For example, some configurations of a probe 7 may risk slipping of the probe ends 13, 15 on the electrical contacts 3. Slippage of the probe 7 may cause one of the probe ends 13, 15 to become separated from an electrical contact 3. It may be desirable to seek probe orientations at which the probe ends 13, 15 are situated relatively near to the highest points on an electrical contact 3 so as to reduce the chances of the probe ends 13, 15 slipping on the electrical contacts 3.

In some embodiments, a test system 101 may comprise a plurality of probes 7 (as is shown in FIG. 6). A plurality of probes may be used to test different DUTs 1 situated on a single device table 103 at the same time. Additionally or alternatively multiple probes 7 may be used to test a single DUT 1 through different electrical contacts 3 at the same time. This may decrease the amount of time required to test a single DUT 1 and/or the amount of time required to test all of the DUTs 1 which are situated on a device table 103. The throughput of the test system 101 may therefore be improved.

Various improvements to a test system have been described above which allow for automated testing of multiple devices 1. Inventive improvements of a sampling module 18, radiation source and delay line (e.g. as shown in FIG. 4) are also contemplated herein and will be described below with reference to FIGS. 13-15.

Figure 13:
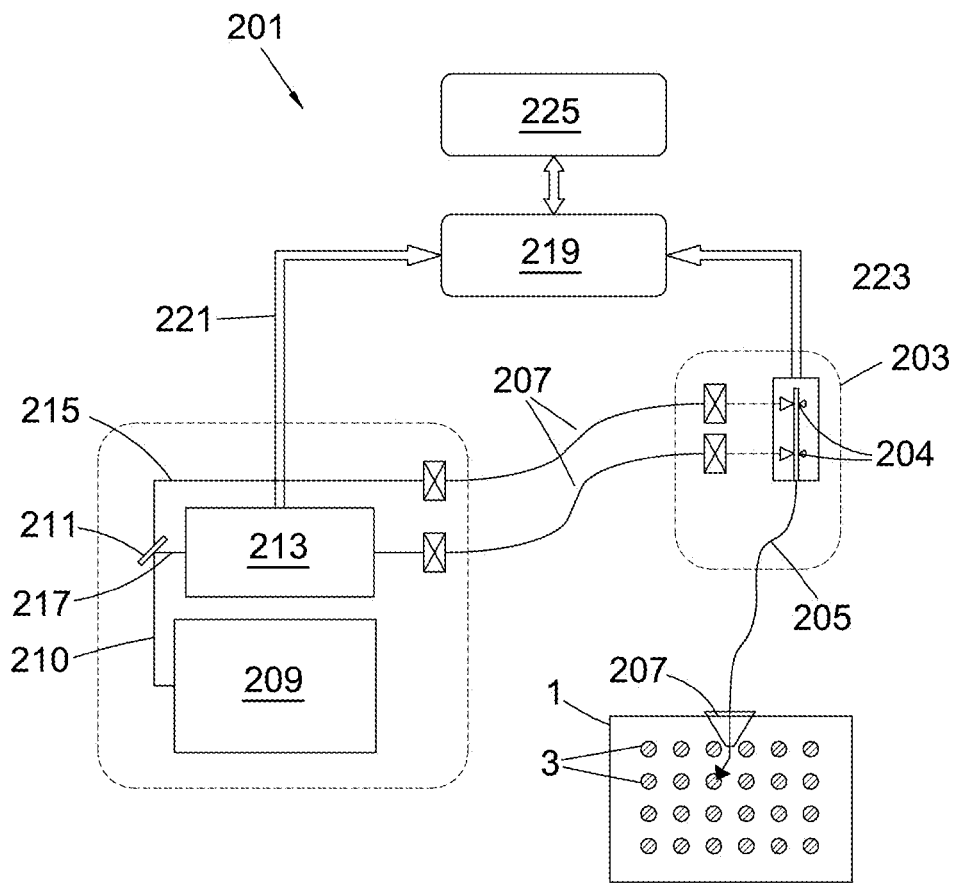
FIG. 13 is a schematic illustration of a portion of a test system according to an embodiment of the invention.

FIG. 13 is a schematic illustration of a portion of a test system 201 according to an embodiment of the invention. The test system 201 which is shown in FIG. 13 may be similar to the test system which was described above with reference to FIG. 4 and may include many of the same or similar components.

The test system 201 comprises a sampling module 203. The sampling module 203 includes first and second photoconductive elements 204, a signal generator (not shown in FIG. 13) and a signal sampler (not shown in FIG. 13). The sampling module 203 is similar to the sampling module 18 which was described above with reference to FIG. 4 and will not be described here in any more detail.

The sampling module is connected to a probe 207 via a coaxial cable 205. The probe 207 is brought into contact with electrical contacts 3 on a DUT 1. Signals from the sampling module 203 are input into the DUT 1 through the probe 207 and signal reflections from the DUT 1 return to the sampling module for analysis.

The test system 201 further comprises a radiation source 209, a beam splitter 211 and a delay line 213. The radiation source 209 may comprise a laser which may, for example, emit near-infrared radiation (e.g. having a wavelength of approximately 800 nm, approximately 1000 nm or approximately 1560 nm). A radiation beam 210 which is emitted from the radiation source 209 is incident on the beam splitter 211. The radiation beam 210 may be a pulsed radiation beam. Pulses of the radiation beam may, for example, have pulse widths of less than about 1 picosecond. The beam splitter 211 splits the radiation beam 210 into a generating beam 215 and a receiving beam 217. The generating beam 215 and the receiving beam 217 are coupled into optical fibres 207 and transmitted to the sampling module 203. In the sampling module 203, the generating beam is directed to be incident on a first photoconductive element 204 and the receiving beam is directed to be incident on a second photoconductive element 204.

The delay line 213 is located in the optical path of the receiving beam 217 and is configured to introduce an optical delay between pulses of the generating beam 215 and pulses of the receiving beam 217. The delay line 213 may be similar to the delay line 37 which was described above with reference to FIG. 4 and may comprise one or more reflectors mounted on a movement stage (not shown in FIG. 13). The movement stage may be moved so as to scan the optical delay between the generating and receiving beams 215, 217.

A prior art delay line arrangement comprises a separate slow scanning delay line and fast scanning delay line. The fast scanning delay line may be a galvanometer driven delay line. In such an arrangement the fast scanning delay line may not provide a sufficiently large range of delay times. For example, a fast scanning delay line may introduce a maximum optical delay of approximately 50 picoseconds. In the prior art arrangement a data segment may be taken over a 50 picosecond range of delay times (corresponding to the maximum optical delay of the fast scanning delay time) and then the slow scanning delay line may be moved in order to obtain another data segment over another 50 picosecond range of delay times. Different data segments are then concatenated together in order to obtain a full data set. The process of obtaining a plurality of different data sets at different positions of the slow-scanning delay line may result in a large acquisition time in order to obtain a full data set.

In the embodiment which is shown in FIG. 13 only a single delay line 213 is used. The delay line 213 is capable of scanning over a large range of delay times at speeds comparable to the speed obtained using a galvanometer driven delay line. The delay line 213 is a direct drive delay line comprising a synchronous linear motor configured to move a reflector so as to vary the optical delay introduced by the delay line 213. The linear motor may be brushless which reduces friction in the motor and improves efficiency. The movement stage may comprise a high quality crossed-roller bearing or air-bearing. By contrast, a prior art delay line arrangement uses a ball-screw drive which limits the top speed and acceleration of a movement stage. A ball-screw also introduces some level of backlash which is avoided by the direct-drive delay line contemplated herein.

The overall acquisition time of a measurement obtainable using a direct drive line as contemplated herein may be greatly improved with respect to prior art arrangements. For example, the acquisition time may be of the order of 60 times faster than is achievable with prior art arrangements.

The test system 201 of FIG. 13 further comprises a digital sampling module 219. The digital sampling module 219 receives a first signal 221 from the delay line 213 and a second signal 223 from the sampling module 203. The digital sampling module 219 simultaneously samples the first and second signals 221, 223 and maintains registration between the two signals such that data from the sampling module can be assigned to a specific delay time introduced by the delay line 213. The digital sampling module interfaces with a controller 225 which may be a computer. The controller 225 may store the data sampled by the digital sampling module 219.

Figure 14:
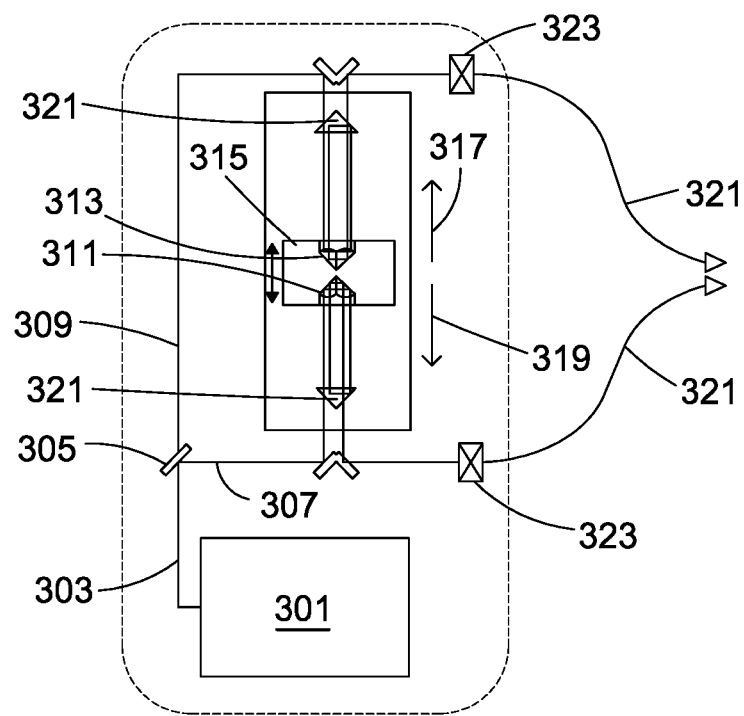
FIG. 14 is a schematic illustration of a delay line arrangement which may form part of a test system according to an embodiment of the invention.

FIG. 14 is a schematic illustration of a delay line arrangement which forms part of a test system according to an embodiment of the invention. The arrangement which is shown in FIG. 14 comprises a radiation source 301 which emits a radiation beam 303. The radiation beam 303 is incident on a beam splitter 305, which splits the radiation beam into a generating beam 307 and a receiving beam 309. Both the generating beam 307 and the receiving beam 309 are provided to a delay line arrangement. The delay line arrangement comprises a first reflector unit 311 which receives the generating beam 307 and a second reflector unit 313 which receives the receiving beam 309. The first and second reflector units 311, 313 may each comprise a single reflector or a plurality of reflectors. The first and second reflector unit 311, 313 may comprise corner cube reflectors.

The first and second reflector units 311, 313 are mounted on a moveable stage 315. The moveable stage 315 is moveable in a first direction 317 and a second direction 319. Movement of the moveable stage 315 in the first direction increases the optical path length of the generating beam 307 and decreases the optical path length of the receiving beam 309. Movement of the moveable stage 315 in a second direction 319 decreases the optical path length of the generating beam 307 and increases the optical path length of the receiving beam 309.

In the arrangement which is shown in FIG. 14 movement of the moveable stage 309 changes the optical path lengths of the generating and receiving beams in opposite directions. Consequently movement of the moveable stage 309 by a first distance introduces a difference in the optical path lengths of the generating and receiving beams which is at least twice the first distance. A smaller movement of the moveable stage is therefore required in order to change the optical delay between the generating and receiving beams (with respect to prior art arrangements) by a given amount. This advantageously allows for faster scanning of the optical delay. An acquisition time in which a given measurement is performed may therefore be significantly reduced.

In the embodiment of FIG. 14, the delay line arrangement further comprises prisms 321 (e.g. roof prisms) situated in the optical paths of the generating and receiving beams 307, 309. The prisms may reflect radiation back to the first and second reflector units such that pulses of radiation undergo multiple reflections at the reflector units 311, 313. Causing pulses of radiation to undergo multiple reflections at the reflector units 311, 313 increases the total optical paths of the pulses through the delay line arrangement. This may increase the optical delay which is introduced between pulses of the generating and receiving beams.

The generating beam 307 and receiving beam 309 which are output from the delay line arrangement are coupled into optical fibres 321 by couplers 323. The optical fibres 321 may transmit the generating and receiving beams to a sampling module.

Figure 15:
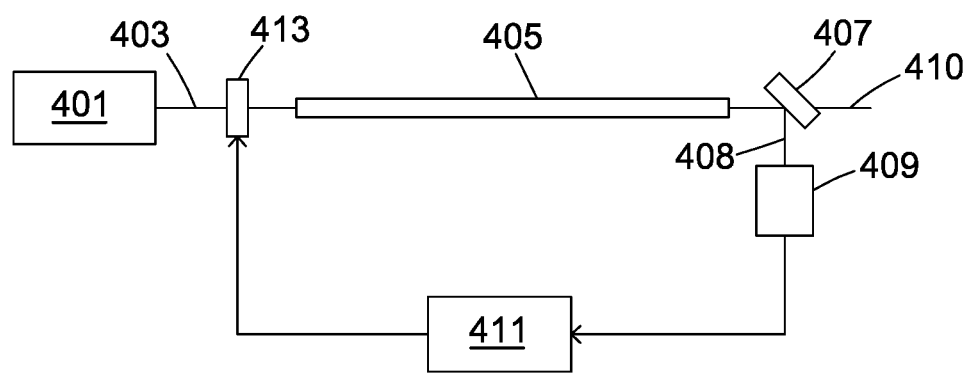
FIG. 15 is schematic illustration of a radiation feedback system which may form part of a test system according to an embodiment of the invention.

FIG. 15 is a schematic illustration of a radiation feedback system which may form part of a test system according to an embodiment of the invention. The arrangement which is shown in FIG. 15 comprises a radiation source 401 (e.g. a laser) which emits a radiation beam 403. The radiation beam 403 is coupled into an optical fibre 405. The optical fibre 405 may be used to transmit the radiation beam 403 to a sampling module (as was described above with reference to other embodiments). The fibre coupling efficiency of the optical fibre 405 may change over time. For example, changes in the temperature of the fibre 405 or other factors such as creep in optics used to couple the radiation beam 403 into the fibre 405 may result in changes in the coupling efficiency over time.

Changes in the fibre coupling efficiency of the optical fibre 405 will cause changes in the power of the radiation beam which is output from the optical fibre 405 (and which may be provided to a sampling module). It may be desirable to maintain a substantially constant average power of radiation which is output from an optical fibre 405 and which may be provided to a sampling module.

In order to stabilise the power of radiation which is output from the optical fibre 405 a radiation feedback system is provided. The radiation feedback system comprises a radiation sensor 409, an attenuator 413 and a controller 411. The radiation beam 403 which is output from the optical fibre 405 is incident on a beam splitter 407. The beam splitter 407 directs a first portion 408 of the radiation beam to the radiation sensor 409. A second portion 410 of the radiation beam may, for example, be provided to a sampling module.

The radiation sensor 409 is configured to detect the intensity of radiation which is output from the optical fibre 405 (the radiation may comprise pulses of radiation). The attenuator 413 is positioned in the optical path of the radiation beam which is emitted from the radiation source 401 before the radiation beam is coupled into the fibre 405. The attenuator 413 is configured to reduce the intensity of the radiation beam by an adjustable amount. The controller 411 is configured to adjust the amount by which the attenuator reduces the intensity of the radiation beam in response to measurements of the intensity of the radiation beam by the radiation sensor 409. For example, if the radiation sensor 409 detects an increase in the intensity of the radiation beam 403 then the controller 411 may act to increase the amount by which the attenuator 413 attenuates the radiation beam 403. If the radiation sensor 409 detects a decrease in the intensity of the radiation beam 403 then the controller 411 may act to decrease the amount by which the attenuator 413 attenuates the radiation beam 403. The radiation feedback system may therefore act to maintain a substantially constant average power of the radiation beam which is output from the optical fibre 405.

The radiation beam may be pulsed and the radiation feedback system may act to maintain a substantially constant average power of the radiation beam, where the average is taken over more than one pulse period. The radiation feedback system may not act to alter the temporal profile of individual pulses. In some embodiments a pulse repetition rate of the radiation beam may be approximately 100 MHz (i.e. a 10 nanosecond pulse period). The radiation feedback system may act to reduce power instabilities at frequencies below about 1 KHz.

The controller 411 may comprise a proportional-integral-derivative (PID) controller. The attenuator 413 may comprise a liquid crystal variable retarder which may be combined with a polariser to provide voltage-controlled attenuation of the radiation beam 403. In other embodiments, a different form of attenuator may be used. For example, the attenuator 413 may comprise a motorised variable neutral-density filter wheel, an acousto-optic modulator or an electro-optic modulator.

In some embodiments, one or more optical components of a test system may be fibre-based. For example, any of the radiation sources described herein may comprise a fibre-laser. Additionally or alternatively any beam splitter or radiation described herein may be based in an optical fibre. In some embodiments one or more components of a delay line may be based in an optical fibre. A fibre-based delay line may comprise a section of optical fibre which is stretched (e.g. using piezoelectric bobbins). However, a fibre-based delay line may not achieve the range of delay times which is possible with a free-space delay line such as those described herein. A test system which includes a delay line may not therefore have all of its optical components based in optical fibres.

In embodiments which include a dual laser system, in which an optical delay between a generating and receiving beam may be adjusted by adjusting a synchronisation between two lasers, it is possible for the entire path of the generating and/or receiving beams to be based within optical fibres.

Various inventive aspects of a test system have been described above and are shown in the figures in the context of specific embodiments of the invention. It will be appreciated that any of the described and/or illustrated aspects may be combined in a single embodiment. For example, one or more features of one embodiment may be combined with one or more features of another embodiment. It will further be appreciated that whilst some embodiments have been described that include more than one inventive aspect, embodiments that comprise only a single inventive aspect are also contemplated herein. In general any of the features of any of the described embodiments may be used in isolation or may be used in any combination with any of the other features of the described embodiments.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A test system for testing a device having a plurality of electrical contacts, the test system comprising:
a device table operable to hold at least one device under test, the device table comprising a plurality of reference structures of different heights, the reference structures extending out of or into the device table at different distances;
a probe comprising at least one probe end for physically contacting electrical contacts of a device under test; and
a movement mechanism operable to move one or both of the device table and the probe so as to bring the at least one probe end into physical contact with at least one electrical contact of a device under test;
wherein the plurality of reference structures provide reference points at the different heights to allow a position of the at least one electrical contact of the device under test, relative to the reference structures, to be determined.

2. The test system of claim 1, wherein at least one of the reference structures comprises a surface having roughness features on a scale of 50 microns or less.

3. The test system of claim 1, wherein the device table is operable to hold a plurality of devices under test.

4. The test system of claim 1, further comprising a kinematically constrained mount on which the device table is mounted, wherein the kinematically constrained mount is configured to constrain movement of the device table in a plurality of degrees of freedom.

5. The test system of claim 1, further comprising a loading device operable to automatically load and unload devices under test from the device table.

6. The test system of claim 1, wherein at least one of the reference structures comprises a substantially spherically shaped tip portion.

7. The test system of claim 6, wherein the spherically shaped tip portion is surrounded by a substantially flat rim.

8. The test system of claim 1, further comprising:
a signal generator configured to generate a signal and direct the signal through at least one of the probe ends such that, in use, the signal is directed into a device under test through an electrical contact of the device under test; and
a signal sampler configured to sample a signal, which passes through at least one of the probe ends such that, in use, signal which is reflected in the device under test and which passes through a probe end is sampled by the signal sampler.

9. The test system of claim 8, wherein the signal generator is configured to generate a broadband signal having frequency components in the range 0.01 GHz to 10 THz.

10. The test system of claim 8, wherein the signal generator comprises:
a source of pulsed radiation;
a first signal conversion device arranged to receive a pulse of radiation from the source of pulsed radiation and configured to output a signal pulse in response to irradiation from the source of pulsed radiation; and
a transmission line arrangement configured to direct the signal pulse from the first signal conversion device through at least one of the probe ends.

11. The test system of claim 10, wherein the signal sampler comprises:
a second signal conversion device arranged to receive a pulse of radiation from the source of pulsed radiation and, in response to irradiation from the source of pulsed radiation, sample a signal pulse received at the second signal conversion device;
wherein the transmission line arrangement is configured to direct a signal pulse reflected from a device under test or transmitted through a device under test and passing through at least one of the probe ends, to the second signal conversion device.

12. The test system of claim 1, wherein the movement mechanism is operable to move one or both of the device table and the probe such that at least one of the probe ends contacts one of the reference structures.

13. The test system of claim 12, further comprising a calibration system configured to allow a determination of the position of the at least one probe end relative to the reference structure.

14. The test system of claim 12, wherein at least one of the reference structures comprises a reference feature marking a reference point on the reference structure, wherein the movement mechanism is operable to move one or both of the device table and the probe such that at least one of the probe ends contacts the reference point.

15. The test system of claim 14, wherein the reference feature comprises a substantially circular groove formed in a reference structure and extending around an apex of the reference structure.

16. The test system of claim 15, wherein the reference feature comprises a plurality of substantially circular grooves formed in a reference structure, each groove extending around an apex of the reference structure.

\* \* \* \* \*